(12) United States Patent
Harada et al.

(10) Patent No.: US 12,072,570 B2
(45) Date of Patent: Aug. 27, 2024

(54) DISPLAY DEVICE

(71) Applicant: SUMITOMO CHEMICAL COMPANY, LIMITED, Tokyo (JP)

(72) Inventors: Yoshihiro Harada, Osaka (JP); Yoshifumi Komatsu, Osaka (JP); Tomohiro Fukuura, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/923,991

(22) PCT Filed: Jul. 13, 2021

(86) PCT No.: PCT/JP2021/026226
§ 371 (c)(1),
(2) Date: Nov. 8, 2022

(87) PCT Pub. No.: WO2022/024743
PCT Pub. Date: Feb. 3, 2022

(65) Prior Publication Data
US 2023/0176421 A1    Jun. 8, 2023

(30) Foreign Application Priority Data
Jul. 30, 2020    (JP) .................. 2020-129096

(51) Int. Cl.
G02F 1/1335    (2006.01)
C09K 11/66    (2006.01)
C09K 11/88    (2006.01)
F21V 8/00    (2006.01)
B82Y 20/00    (2011.01)

(52) U.S. Cl.
CPC ...... *G02F 1/133514* (2013.01); *C09K 11/665* (2013.01); *C09K 11/883* (2013.01); *G02B 6/005* (2013.01); *G02F 1/133614* (2021.01); *B82Y 20/00* (2013.01)

(58) Field of Classification Search
CPC ......... G02F 1/133614; G02F 1/133514; C09K 11/883
See application file for complete search history.

(56) References Cited

U.S. PATENT DOCUMENTS

2015/0331165 A1    11/2015 Ryu et al.
2016/0033822 A1*    2/2016 Jiang ................. G02F 1/133602
349/33

FOREIGN PATENT DOCUMENTS

JP    2015-194637 A    11/2015
JP    2015-232694 A    12/2015
JP    2017-125899 A    7/2017
KR    2019-0036649 A    4/2019
(Continued)

OTHER PUBLICATIONS

Innovation Q+ NPL Search (Year: 2023).*
(Continued)

*Primary Examiner* — Anabel Ton
(74) *Attorney, Agent, or Firm* — Foley & Lardner LLP

(57) ABSTRACT

A display device including a light source (A), a color conversion layer (B), and a color filter (C), wherein the color conversion layer (B) contains quantum dots (B-r) that emit red light, the color filter (C) has a blue color filter (C-b), a green color filter (C-g), and a red color filter (C-r), and the display device satisfies α≤1.80 and (II) β≥63.0.

10 Claims, 3 Drawing Sheets

(56) References Cited

FOREIGN PATENT DOCUMENTS

| TW | 202205698 A | * | 2/2022 | ........... C09K 11/025 |
|----|----|----|----|----|
| WO | WO-2015/045735 A1 | | 4/2015 | |
| WO | WO-2018/168638 A1 | | 9/2018 | |
| WO | WO-2019/188829 A1 | | 10/2019 | |

OTHER PUBLICATIONS

International Searching Authority, "International Search Report," issued in connection with International Patent Application No. PCT/JP2021/026226, dated Sep. 7, 2021.

International Searching Authority, "Written Opinion," issued in connection with International Patent Application No. PCT/JP2021/026226, dated Sep. 7, 2021.

* cited by examiner

[Figure 3]

[Figure 4]
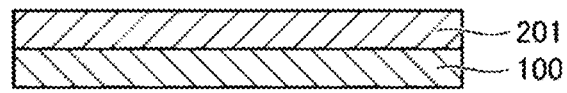

DISPLAY DEVICE

CROSS-REFERENCE TO RELATED APPLICATIONS

The present application claims priority under 37 U.S.C. § 371 to International Patent Application No. PCT/JP2021/026226, filed Jul. 13, 2021, which claims priority to and the benefit of Japanese Patent Application No. 2020-129096, filed on Jul. 30, 2020. The contents of these applications are hereby incorporated by reference in their entireties.

TECHNICAL FIELD

The present invention relates to a display device comprising a light source, a color conversion layer, and a color filter.

BACKGROUND ART

Patent Literature 1 proposes a display device including an optical conversion unit containing quantum dots that emit green light and a green color filter.

Patent Literature 2 proposes a display device including a film made of a mixture of a perovskite compound having a light-emitting property, and an indium compound having a light emitting-property or a cadmium compound having a light-emitting property.

CITATION LIST

Patent Literature

Patent Literature 1: International Publication No. 2015/045735
Patent Literature 2: International Publication No. 2018/168638

SUMMARY OF INVENTION

Technical Problem

In a conventionally proposed display device including a light source, a color conversion layer, and a color filter, a wide color gamut and excellent extraction efficiency may not be simultaneously obtained.

An object of the present invention is to achieve both a wide color gamut and extraction efficiency in a display device comprising a light source, a color conversion layer, and a color filter.

Solution to Problem

The present invention provides the following display device.

[1] A display device comprising: a light source (A); a color conversion layer (B); and a color filter (C),
wherein the color conversion layer (B) contains quantum dots (B-r) that emit red light,
the color filter (C) has a blue color filter (C-b), a green color filter (C-g), and a red color filter (C-r), and
the display device satisfies the following conditions (I) and (II):

$\alpha \leq 1.80$; and (I)

$\beta \geq 63.0$, (II)

wherein $\alpha = \alpha_b + \alpha_g + \alpha_r$, and $\beta = \beta_b + \beta_g + \beta_r$;

in a spectrum curve I(x) obtained by plotting intensity I of light emitted from the color conversion layer (B) when the color conversion layer (B) is irradiated with light from the light source (A) versus wavelength x, when a pulse function that gives 0 in wavelength ranges of 380 nm≤x<440 nm, 460 nm<x<520 nm, 540 nm<x<620 nm, and 650 nm<x≤780 nm, and gives a value equal to the maximum intensity of the spectrum curve I(x) in wavelength ranges of 440 nm≤x≤460 nm, 520 nm≤x≤540 nm, and 620 nm≤x≤650 nm is expressed by a function f(x), $\alpha_b$ represents a proportion of a region that does not overlap with a region of the function f(x) in a region of the spectrum curve I(x) in a wavelength range of 380 nm≤x<495, $\alpha_g$ represents a proportion of a region that does not overlap with a region of the function f(x) in a region of the spectrum curve I(x) in a wavelength range of 495 nm≤x≤585, and $\alpha_r$ represents a proportion of a region that does not overlap with a region of the function f(x) in a region of the spectrum curve I(x) in a wavelength range of 585 nm<x≤780; and in a spectrum curve $T_b(x)$ obtained by plotting light transmittance $T_b$ of the blue color filter (C-b) versus wavelength x, in a spectrum curve $T_g(x)$ obtained by plotting light transmittance $T_g$ of the green color filter (C-g) versus wavelength x, and in a spectrum curve $T_r(x)$ obtained by plotting light transmittance $T_r$ of the red color filter (C-r) versus wavelength x, when a pulse function that gives 0 in wavelength ranges of 380 nm≤x<440 nm, 460 nm<x<520 nm, 540 nm<x<620 nm, and 650 nm<x≤780 nm, and gives a light transmittance of 100% in wavelength ranges 440 nm≤x≤460 nm, 520 nm≤x≤540 nm, and 620 nm≤x≤650 nm is represented by a function g(x), $\beta_b$ represents an area of a region where a region of the spectrum curve $T_b(x)$ and a region of the function g(x) overlap in the wavelength range of 440 nm≤x≤460 nm, $\beta_g$ represents an area of a region where a region of the spectrum curve $T_g(x)$ and a region of the function g(x) overlap in the wavelength range of 520 nm≤x≤540 nm, and $\beta_r$ represents an area of a region where a region of the spectrum curve $T_r(x)$ and a region of the function g(x) overlap in the wavelength range of 620 nm≤x≤650 nm.

[2] The display device according to [1], wherein the light source (A) emits light having a peak at a wavelength of 600 nm or less.

[3] The display device according to [1] or [2], wherein the light emitted from the color conversion layer (B) when the color conversion layer (B) is irradiated with light from the light source (A) is white light.

[4] The display device according to any one of [1] to [3], wherein the spectrum curve I(x) has a peak in each of the wavelength ranges of 440 nm to 460 nm, 520 nm to 540 nm, and 620 nm to 650 nm, and a full width at half maximum of each peak is 20 nm to 80 nm.

[5] The display device according to any one of [1] to [4], wherein the quantum dots (B-r) that emit red light contain at least one selected from the group consisting of particles of an indium compound and particles of a cadmium compound.

[6] The display device according to any one of [1] to [5], wherein the color conversion layer (B) has a thickness of 1 μm or more and 300 μm or less.

[7] The display device according to any one of [1] to [6], wherein the spectrum curve $T_b(x)$ has a peak in a wavelength range of 440 nm to 460 nm.

[8] The display device according to any one of [1] to [7], wherein the spectrum curve $T_g(x)$ has a peak in a wavelength range of 520 nm to 540 nm.

[9] The display device according to any one of [1] to [8], wherein the spectrum curve $T_r(x)$ has a peak in a wavelength range of 620 nm to 650 nm.

[10] The display device according to any one of [1] to [9], wherein a coverage of the color gamut of Rec. ITU-R BT.2020 is 54% or more, and extraction efficiency is 32% or more.

[11] A display comprising the display device according to any one of [1] to [10].

Advantageous Effects of Invention

According to the present invention, it is possible to achieve both a wide color gamut and excellent extraction efficiency in a display device comprising a light source, a color conversion layer, and a color filter.

BRIEF DESCRIPTION OF DRAWINGS

FIG. 3 is a schematic cross-sectional view showing a display device according to an embodiment of the present invention.

FIG. 4 is a schematic cross-sectional view showing a display according to an embodiment of the present invention.

DESCRIPTION OF EMBODIMENTS

<Display Device>

The display device includes a light source (A), a color conversion layer (B), and a color filter (C). The display device is a device that irradiates the color conversion layer (B) with light emitted from the color conversion layer (B) when the color conversion layer (B) is irradiated with light from the light source (A) to cause quantum dots (B-r) that emit red light (hereinafter, abbreviated as quantum dots (B-r)) to emit light, and extracts the light through the color filter (C).

The expression "emit blue light" refers to "emit any light visible as blue (any light having intensity in a blue wavelength region, for example, 380 nm to 495 nm)," and is not limited to "emit light having a single wavelength." The expression "emit green light" refers to "emit any light visible as green (any light having intensity in a green wavelength region, for example, 495 nm to 585 nm)," and is not limited to "emit light having a single wavelength." The expression "emit red light" refers to "emit any light visible as red (any light having intensity in a red wavelength region, for example, 585 nm to 780 nm)," and is not limited to "emit light having a single wavelength."

The display device may include layers such as a light guide plate, a reflection film, a diffusion film, a brightness enhancement unit, a prism sheet, and a medium material layer between elements.

When the following conditions (I) and (II) are simultaneously satisfied, the display device can achieve both a wide color gamut and excellent extraction efficiency. In a conventionally proposed display device including a light source, a color conversion layer, and a color filter, it may be difficult to achieve both a wide color gamut and excellent extraction efficiency in many cases. It is considered that this is because light having intermediate color wavelengths can be contained in each of blue light, green light, and red light obtained through a color filter, so that sufficient color reproducibility is not easily exhibited; and on the other hand, when such light having intermediate color wavelengths is excluded, the brightness is lowered and the extraction efficiency is not sufficient. As a result of studies, it has been found that the light having intermediate color wavelengths is more easily excluded and high brightness is more easily obtained when a specific pulse function is set; a proportion of a region of a spectrum curve of emission emitted from the color conversion layer, the region protruding from the region of the pulse function, is smaller; and a proportion of a region of a spectrum curve of transmitted light from the color filter, the region covering the region of the pulse function, is higher.

<Condition (I)>

Figure 1:
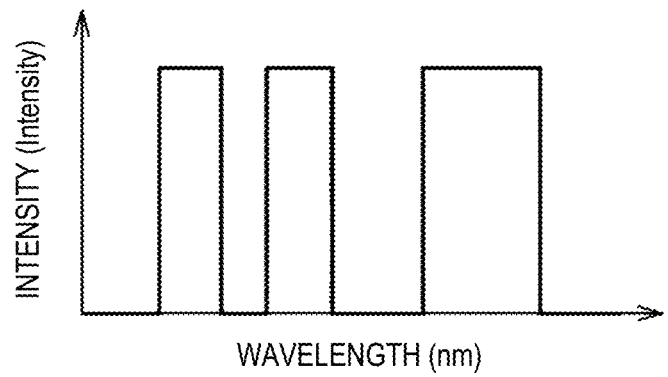
FIGS. 1(a)-1(c) are schematic diagrams for describing condition (I) of the present invention.
Figure 1:
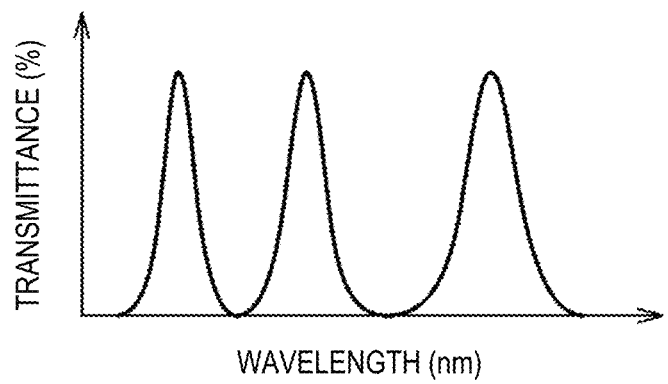
Figure 1:
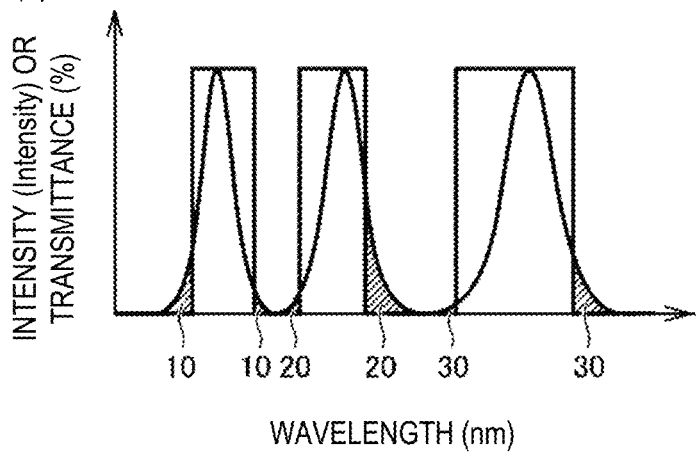

The condition (I) is described with reference to FIGS. 1(a)-1(c). FIG. 1(a) shows a pulse function f(x), FIG. 1(b) shows a spectrum curve I(x) of light emitted from the color conversion layer (B), and FIG. 1(c) shows, as hatched regions, regions 10, 20, 30 that do not overlap with the region of the pulse function f(x) in the region of the spectrum curve I(x). In FIG. 1(c), the non-overlapping region 10 is the region of $\alpha_b$, the non-overlapping region 20 is the region of $\alpha_g$, and the non-overlapping region 30 is the region of $\alpha_r$. The region of the spectrum curve I(x) is a region between the spectrum curve and the horizontal axis, and the region of the pulse function f(x) is a region between the waveform of the pulse function f(x) and the horizontal axis.

When the total of $\alpha_b$, $\alpha_g$, and $\alpha_r$ is assumed to be α, α satisfies α≤1.80, preferably α≤1.60, more preferably α≤1.45, still more preferably α≤1.40, particularly preferably α≤1.35, more particularly preferably α≤1.30, still more particularly preferably α≤1.25, and usually 0.50≤α, from the viewpoint of color gamut and extraction efficiency. All of $\alpha_b$, $\alpha_g$, and $\alpha_r$ are preferably 0.80 or less, and more preferably 0.60 or less. α can be calculated according to [Expression 2] shown in the column of Examples described later.

The pulse function f(x) is a function that gives 0 in the wavelength ranges of 380 nm≤x<440 nm, 460 nm<x<520 nm, 540 nm<x<620 nm, and 650 nm<x≤780 nm, and gives a value equal to the maximum intensity of the spectrum curve I(x) in the wavelength ranges of 440 nm≤x≤460 nm, 520 nm≤x≤540 nm, and 620 nm≤x≤650 nm, and the pulse function f(x) preferably gives 0 in the wavelength ranges of 380 nm≤x<445 nm, 460 nm<x<525 nm, 535 nm<x<630 nm, and 650 nm<x≤780 nm, and gives a value equal to the maximum intensity of the spectrum curve I(x) in the wavelength ranges of 445 nm≤x≤460 nm, 525 nm≤x≤535 nm, and 630 nm≤x≤650 nm, from the viewpoint of color gamut and extraction efficiency.

Light emitted from the color conversion layer (B) when the color conversion layer (B) is irradiated with light from the light source (A) is preferably white light. The spectrum curve I(x) of the light emitted from the color conversion layer (B) preferably has a peak in each of the wavelength ranges of 440 nm to 460 nm, 520 nm to 540 nm, and 620 nm to 650 nm, and a full width at half maximum of each peak is 20 nm to 80 nm, and more preferably a peak in each of the wavelength ranges of 445 nm to 455 nm, 525 nm to 535 nm, and 625 nm to 645 nm, and a full width at half maximum of each peak is 20 to 50 nm, from the viewpoint of color gamut and extraction efficiency. The spectrum curve I(x) is measured by the method described in the Examples section below. The full width at half maximum of the peak of the spectrum curve I(x) is still more preferably 20 nm or more and 40 nm or less, and particularly preferably 20 nm or more and 30 nm or less.

<Condition (II)>

Figure 2A:
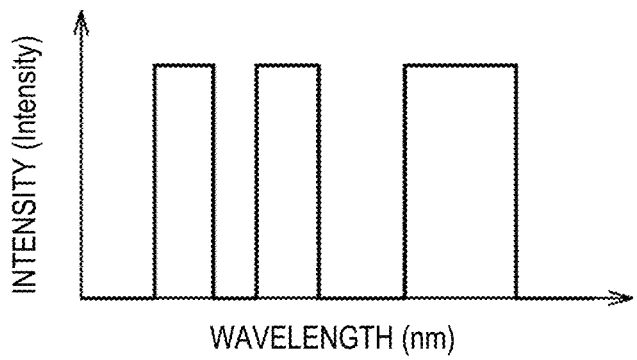
FIGS. 2(a)-2(c) are schematic diagrams for describing condition (II) of the present invention.
Figure 2B:
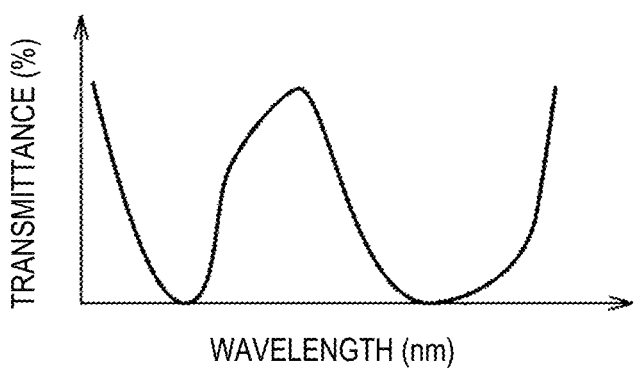
Figure 2C:
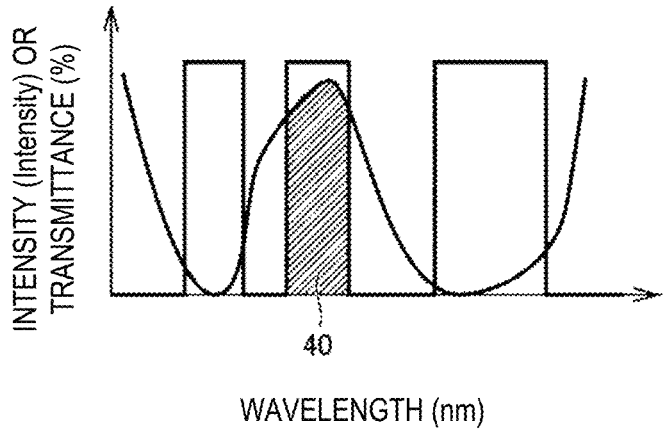
Figure 2C:
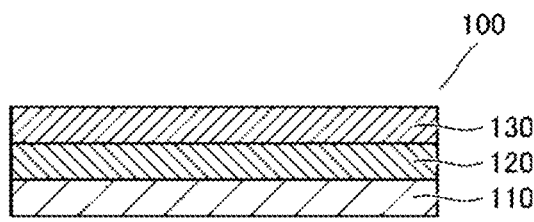

The condition (II) is described taking the green color filter (C-g) as an example with reference to FIGS. 2(a)-2(c). FIG. 2(a) shows a pulse function g(x), FIG. 2(b) shows a spectrum curve $T_g(x)$ of the green color filter (C-g), and FIG. 2(c) shows, as a hatched region, an area $β_g$ of a region 40 where the region of the spectrum curve Tg(x) and the region of the pulse function g(x) overlap. The same applies to the blue color filter (C-b) and the red color filter (C-r). The region of the spectrum curve Tg(x) is a region between the spectrum curve and the horizontal axis, and the region of the pulse function g(x) is a region between the waveform of the pulse function g(x) and the horizontal axis.

When the total of $β_b$, $β_g$, and $β_r$ is assumed to be β, the color filter (C) satisfies β≥63.0, preferably β≥63.5, more preferably β≥64.0, still more preferably β≥64.5, particularly preferably β≥65.0, and usually β≤70.0, from the viewpoint of color gamut and extraction efficiency. With respect to the color filter (C), all of $β_b$, $β_g$, and $β_r$ are preferably 10 or more, and more preferably 15 or more. β can be calculated according to [Expression 3] shown in the column of Examples described later.

The pulse function g(x) is a function that gives 0 in the wavelength ranges of 380 nm≤x<440 nm, 460 nm<x<520 nm, 540 nm<x<620 nm, and 650 nm<x≤780 nm, and gives a light transmittance of 100% in the wavelength ranges 440 nm≤x≤460 nm, 520 nm≤x≤540 nm, and 620 nm≤x≤650 nm, and the pulse function g(x) preferably gives 0 in the wavelength ranges of 380 nm≤x<445 nm, 455 nm<x<525 nm, 535 nm<x<625 nm, and 645 nm<x≤780 nm, and gives a light transmittance of 100% in the wavelength ranges 445 nm≤x≤455 nm, 525 nm≤x≤535 nm, and 625 nm≤x≤645 nm, from the viewpoint of color gamut and extraction efficiency.

The spectrum curve $T_b(x)$ preferably has a peak in the wavelength range of 440 nm to 460 nm, and more preferably a peak in the wavelength range of 445 nm to 455 nm, from the viewpoint of color gamut and extraction efficiency.

The spectrum curve $T_g(x)$ preferably has a peak in the wavelength range of 520 nm to 540 nm, and more preferably a peak in the wavelength range of 525 nm to 535 nm, from the viewpoint of color gamut and extraction efficiency.

The spectrum curve $T_r(x)$ preferably has a peak in the wavelength range of 620 nm to 650 nm, and more preferably a peak in the wavelength range of 625 nm to 645 nm, from the viewpoint of color gamut and extraction efficiency.

The spectrum curve $T_b(x)$, spectrum curve $T_g(x)$, and spectrum curve $T_r(x)$ are measured by the method described in the column of Examples described later.

The pulse function f(x) and the pulse function g(x) may give 0 and have the same waveform in the same wavelength range.

The conditions (I) and (II) can be simultaneously satisfied by, for example, adjusting the peak wavelength and peak intensity of light emitted from the light source, adjusting the emission intensity, peak wavelength, and the like of the color conversion layer, adjusting the chromaticity and light transmittance of the color filter, and the like.

Specific examples of adjusting the emission intensity, peak wavelength, and the like of the color conversion layer include adjusting the types, average particle sizes, contents, and the like of the quantum dots and fluorescent particles in the quantum dot composition described later, and the types, contents, and the like of the polymers, and adjusting the thickness of the color conversion layer.

Specific examples of adjusting the chromaticity and light transmittances of the color filter include adjusting the types, contents, and the like of the colorants and resins in the coloring curable resin composition described later, and adjusting the thicknesses of the color filter.

<Light Source>

The light source (A) is a light source that emits light capable of causing the quantum dots (B-r) in the color conversion layer (B) to emit light, and as the light source (A), for example, a known light source such as a light emitting diode (LED) including a blue light-emitting diode, a laser, and an EL can be used. The light source (A) is preferably a light source that emits light having a peak of 600 nm or less, and more preferably a light source that emits blue light, from the viewpoint of color gamut and extraction efficiency. The peak of the light emitted from the light source (A) is measured according to the method described in the column of Examples described later. The light source (A) more preferably has a peak in the wavelength range of 440 nm to 460 nm. The full width at half maximum of the peak of the light source (A) is preferably 20 nm to 80 nm.

The light source (A) can be used as a backlight in combination with the color conversion layer (B). The backlight may include a light guide plate.

<Color Conversion Layer>

The color conversion layer (B) is preferably one capable of converting light from the light source (A) into white light. The color conversion layer (B) may be a member that absorbs a part of light from the light source (A) and emits red light and that transmits another part of the light from the light source (A) to convert primary light into white light. White light refers to light in which at least blue light, red light, and green light are mixed.

The color conversion layer (B) contains quantum dots (B-r) that emit red light.

The thickness of the color conversion layer (B) may be, for example, 0.01 μm or more and 1000 mm or less, preferably 0.1 μm or more and 10 mm or less, more preferably 1 μm or more and 1 mm or less, and still more preferably 10 μm or more and 150 μm or less. The thickness of the color conversion layer (B) is measured according to the method described in the column of Examples described later.

The color conversion layer (B) may be a layer containing a cured product of a curable resin composition (hereinafter, also referred to as quantum dot composition) containing the quantum dots (B-r). The color conversion layer (B) may have a single-layer structure consisting of a layer containing a cured product of a quantum dot composition or a multi-layer structure including a plurality of layers. When the color conversion layer (B) has a multi-layer structure, the color conversion layer (B) may have two or more layers containing a cured product of the quantum dot composition, or may have a layer other than the layer containing a cured product of the quantum dot composition. Examples of the layer other than the layer containing a cured product of the quantum dot composition include any layer such as a substrate, a barrier layer, a light scattering layer, or the like, described later.

[Quantum Dots]

The emission spectrum (peak) of the red light emitted by the quantum dots (B-r) preferably has a maximum value in the wavelength range of 610 nm to 750 nm. When the maximum value is in the wavelength range of 610 nm to 750 nm, the color purity of the red light corresponding to the peak is particularly high, so that the brightness of the red light of the display device can be further improved. The maximum value is more preferably present in the wavelength range 620 nm to 650 nm. The emission spectrum of the quantum dots (B-r) is measured according to the method described in the column of Examples described later.

The emission spectrum of the quantum dots (B-r) preferably has a full width at half maximum of 10 nm to 80 nm. When the full width at half maximum is 80 nm or less, the color purity of the red light is high in the light emitted from the color conversion layer (B), so that the brightness of the red light of the display device can be further improved. On the other hand, the full width at half maximum of the emission spectrum of the red light is more preferably 10 nm to 45 nm, and still more preferably 10 nm to 35 nm. The full width at half maximum of the peak of the emission spectrum of the quantum dots (B-r) is preferably 20 nm or more and 80 nm or less.

Examples of the indium compound include a Group III-V indium compound, a Group III-VI indium compound, and a Group I-III-VI indium compound, preferably a Group III-V indium compound, and more preferably an indium compound containing a phosphorus element as the Group V.

Examples of the cadmium compound include a Group II-VI cadmium compound and a Group II-V cadmium compound.

The indium compound does not contain a cadmium element, and the cadmium compound does not contain an indium element.

[Group III-V Indium Compound]

The Group III-V indium compound is a compound containing a Group III element and a Group V element, and is a compound containing at least an indium element. Here, the Group III means the Group 13 of the periodic table, and the Group V means the Group 15 of the periodic table (the same applies hereinafter). As used herein, the "periodic table" means a long-period periodic table.

The Group III-V indium compound may be a binary system, a ternary system, or a quaternary system.

The binary Group III-V indium compound may be a compound containing an indium element (first element) and a Group V element (second element), and examples thereof include InN, InP, InAs, and InSb.

The ternary Group III-V indium compound may be a compound containing an indium element (first element) and two elements selected from Group V (second element), or may be a compound containing two elements selected from Group III (first element) in which one is an indium element and one element selected from Group V (second element).

Examples of the ternary Group III-V indium compound include InPN, InPAs, InPSb, and InGaP.

The quaternary Group III-V indium compound is a compound containing two elements selected from Group III (first element) in which one is an indium element and two elements selected from Group V (second element).

Examples of the quaternary Group III-V indium compound include InGaPN, InGaPAs, and InGaPSb.

A semiconductor containing the Group III-V indium compound may contain an element other than those of the Group 13 and Group 15 of the periodic table (excluding the element of cadmium) as a doping element.

[Group III-VI Indium Compound]

The Group III-VI indium compound is a compound containing a Group III element and a Group VI element, and is a compound containing at least an indium element. Here, the Group VI means the Group 16 of the periodic table (the same applies hereinafter).

The Group III-VI indium compound may be a binary system, a ternary system, or a quaternary system.

The binary Group III-VI indium compound may be a compound containing an indium element (first element) and a Group VI element (second element), and examples thereof include $In_2S_3$, $In_2Se_3$, and $In_2Te_3$.

The ternary Group III-VI indium compound may be a compound containing an indium element (first element) and two elements selected from Group VI (second element), or may be a compound containing two elements selected from Group III (first element) in which one is an indium element and one element selected from Group VI (second element).

Examples of the ternary Group III-VI indium compound include $InGaS_3$, $InGaSe_3$, $InGaTe_3$, $In_2SSe_2$, and $In_2TeSe_2$.

The quaternary Group III-VI indium compound is a compound containing two elements selected from Group III (first element) in which one is an indium element and two elements selected from Group VI (second element).

Examples of the quaternary Group III-VI indium compound include $InGaSSe_2$, $InGaSeTe_2$, and $InGaSTe_2$.

A semiconductor containing the Group III-VI indium compound may contain an element other than those of the Group 13 and Group 16 of the periodic table (excluding the element of cadmium) as a doping element.

[Group I-III-VI Indium Compound]

The Group I-III-VI indium compound is a compound containing a Group I element, a Group III element and a Group VI element, and is a compound containing at least an indium element. Here, the Group I means the Group 11 of the periodic table (the same applies hereinafter).

The Group I-III-VI indium compound may be a ternary system or a quaternary system.

The ternary Group I-III-VI indium compound is a compound containing an element selected from Group I (first element), an indium element (second element), and an element selected from Group VI (third element).

Examples of the ternary Group I-III-VI indium compound include $CuInS_2$.

A semiconductor containing the Group I-III-VI indium compound may contain an element other than those of the Group 11, Group 13, and Group 16 of the periodic table (excluding the element of cadmium) as a doping element.

From the viewpoint of obtaining sufficient emission intensity, the indium compound is preferably InP, $CuInS_2$, InNP, and GaInNP, and more preferably InP and $CuInS_2$.

[Group II-VI Cadmium Compound]

The Group II-VI cadmium compound is a compound containing a Group II element and a Group VI element, and is a compound containing at least a cadmium element. Here, the Group II means the Group 2 or Group 12 of the periodic table (the same applies hereinafter).

The Group II-VI cadmium compound may be a binary system, a ternary system, or a quaternary system.

The binary Group II-VI cadmium compound may be a compound containing a cadmium element (first element) and a Group 16 element (second element), and examples thereof include CdS, CdSe, and CdTe.

The ternary Group II-VI cadmium compound may be a compound containing a cadmium element (first element) and two elements selected from Group VI (second element), or may be a compound containing two elements selected from Group II (first element) in which one is a cadmium element and one element selected from Group VI (second element).

Examples of the ternary Group II-VI cadmium compound include CdSeS, CdSeTe, CdSTe, CdZnS, CdZnSe, CdZnTe, CdHgS, CdHgSe, and CdHgTe.

The quaternary Group II-VI cadmium compound is a compound containing two elements selected from Group II (first element) in which one is a cadmium element and two elements selected from Group VI (second element).

Examples of the quaternary Group II-VI cadmium compound include CdZnSeS, CdZnSeTe, CdZnSTe, CdHgSeS, CdHgSeTe, and CdHgSTe.

A semiconductor containing the Group II-VI cadmium compound may contain an element other than those of the Group 2, Group 12, and Group 16 of the periodic table (excluding the element of indium) as a doping element.

[Group II-V Cadmium Compound]

The Group II-V cadmium compound is a compound containing a Group II element and a Group V element, and is a compound containing at least a cadmium element.

The Group II-V cadmium compound may be a binary system, a ternary system, or a quaternary system.

The binary Group II-V cadmium compound may be a compound containing a cadmium element (first element) and a Group V element (second element), and examples thereof include $Cd_3P_2$, $Cd_3As_2$, and $Cd_3N_2$.

The ternary Group II-V cadmium compound may be a compound containing a cadmium element (first element) and two elements selected from Group V (second element), or may be a compound containing two elements selected from Group II (first element) in which one is a cadmium element and one element selected from Group V (second element).

Examples of the ternary Group II-V cadmium compound include $Cd_3PN$, $Cd_3PAs$, $Cd_3AsN$, $Cd_2ZnP_2$, $Cd_2ZnAs_2$, and $Cd_2ZnN_2$.

The quaternary Group II-V cadmium compound is a compound containing two elements selected from Group II (first element) in which one is a cadmium element and two elements selected from Group V (second element).

Examples of the quaternary Group II-V cadmium compound include CdZnPN, CdZnPAs, and $Cd_2ZnAsN$.

A semiconductor containing the Group II-V cadmium compound may contain an element other than those of the Group 2, Group 12, and Group 15 of the periodic table (excluding the element of indium) as a doping element.

From the viewpoint of obtaining sufficient emission intensity, the cadmium compound is preferably CdS, CdSe, ZnCdS, CdSeS, CdSeTe, CdSTe, CdZnS, CdZnSe, CdZnTe, ZnCdSSe, CdZnSeS, CdZnSeTe, or CdZnSTe, more preferably CdS, CdSe, ZnCdS, CdSeS, CdZnS, CdZnSe, ZnCdSSe, or CdZnSeS, still more preferably CdS, CdSe, ZnCdS, ZnCdSSe, or CdZnSeS, and particularly preferably CdSe or CdZnSeS.

The particles of the indium compound and the particles of the cadmium compound may have an inorganic protective layer on the surface of the particles from the viewpoint of emission intensity and durability. The inorganic protective layer may be formed of two or more layers or one layer. Examples of the inorganic material capable of forming the inorganic protective layer include, but are not limited to, a semiconductor having a larger band gap than that of an indium compound and/or a cadmium compound. The inorganic protective layer is formed of a known inorganic material such as ZnS.

The quantum dots (B-r) can be synthesized by a wet chemical process, a metal organic chemical vapor deposition process, or a molecular beam epitaxy process. The wet chemical process is a method in which a precursor material is placed in an organic solvent to grow particles. During crystal growth, the organic solvent naturally coordinates to the surface of the quantum dot crystal and acts as a dispersant to regulate crystal growth, and thus, the growth of nanoparticles can be controlled through an easier and less expensive process compared to vapor deposition methods such as metal organic chemical vapor deposition (MOCVD) and molecular beam epitaxy (MBE).

[Green Fluorescent Particles]

The color conversion layer (B) may further contain green fluorescent particles (B-g) that emit green light in addition to quantum dots (B-r). When the color conversion layer (B) contains the green fluorescent particles (B-g), a part of light incident on the color conversion layer (B) from the light source (A) is converted into red light by the quantum dots (B-r) and the red light is emitted from the color conversion layer (B), another part of the light is converted into green light by the green fluorescent particles (B-g) and the green light is emitted from the color conversion layer (B), and yet another part of the light transmits through the color conversion layer (B) as it is from the light source (A), thereby the light from the light source (A), the red light, and the green light are mixed, so that white light tends to be more likely to be emitted from the color conversion layer (B).

The emission spectrum of the green fluorescent particles (B-g) preferably has a full width at half maximum of 10 nm to 80 nm. When the full width at half maximum is 30 nm or less, the color purity of the green light is high, so that the brightness of the green light of the display device can be further improved. On the other hand, when the full width at half maximum is 10 nm or more, it tends to be advantageous from the viewpoint of the synthesis of the green fluorescent particles. The full width at half maximum of the emission spectrum of the green light is more preferably 10 nm to 60 nm, still more preferably 10 nm to 40 nm, yet still more preferably 10 nm to 30 nm, and particularly preferably 20 nm to 30 nm.

The emission spectrum (peak) of the green light emitted from the green fluorescent particles (B-g) preferably has a maximum value in the wavelength range of 500 nm to 560 nm. When the maximum value is in the range of 500 nm to 560 nm, the color purity of the green light corresponding to the peak is particularly high, so that the brightness of the green light of the display device can be further improved. The maximum value is more preferably present in the wavelength range of 520 nm to 540 nm. The emission spectrum emitted from the green fluorescent particles (B-g) is measured by the method described in the column of Examples described later.

[Perovskite Fluorescent Particles]

A preferred example of the green fluorescent particles (B-g) is perovskite fluorescent particles.

The perovskite fluorescent particles (B-g) are particles of a compound containing A, B, and X as constituents and having a perovskite crystalline structure (hereinafter, also referred to as perovskite compound).

A is a component positioned at each apex of a hexahedron including B as the center in the perovskite crystalline structure and is a monovalent cation.

X represents a component positioned at each apex of an octahedron including B as the center in the perovskite crystalline structure and is one or more anions selected from the group consisting of a halide ion and a thiocyanate ion.

B is a component positioned at the center of the hexahedron disposing A as each apex and the center of the octahedron disposing X as each apex in the perovskite crystalline structure and is a metal ion.

The perovskite compound containing A, B, and X as constituents is not particularly limited and may be a compound having any one of a three-dimensional structure, a two-dimensional structure, and a pseudo-two-dimensional structure.

In the case of the three-dimensional structure, the compositional formula of the perovskite compound is represented as follows:

$$ABX_{(3+\delta)} \quad \text{[Formula 1]}$$

In the case of the two-dimensional structure, the compositional formula of the perovskite compound is represented as follows:

$$A_2BX_{(4+\delta)} \quad \text{[Formula 2]}$$

δ is a number that can be appropriately changed according to the charge balance of B and is −0.7 or more and 0.7 or less.

The perovskite crystalline structure as used herein can be ascertained by an X-ray diffraction pattern.

In the case of the compound having a perovskite crystalline structure of the three-dimensional structure, a peak derived from (hkl)=(001) or a peak derived from (hkl)=(110) is usually ascertained at a position of 2θ=12 to 18° or 2θ=12 to 25°, respectively, in the X-ray diffraction pattern. The peak derived from (hkl)=(001) or the peak derived from (hkl)=(110) is more preferably ascertained at a position of 2θ=13 to 16° or 2θ=20 to 23°, respectively.

In the case of the compound having a perovskite crystalline structure of the two-dimensional structure, a peak derived from (hkl)=(002) is usually ascertained at a position of 2θ=1 to 10°, and the peak derived from (hkl)=(002) is more preferably ascertained at a position of 2θ=2 to 8°, in the X-ray diffraction pattern.

The perovskite compound is preferably a perovskite compound represented by the following formula (1):

[Expression 1]

$$ABX_{(3+\delta)}(-0.7 \leq \delta \leq 0.7) \quad (1)$$

In the formula, A is a component positioned at each apex of a tetrahedron including B as the center in the perovskite crystalline structure and is a monovalent cation.

The monovalent cation is preferably a cesium ion, an organic ammonium ion, or an amidinium ion, and more preferably a cesium ion, $CH_3NH_3^+$ (also referred to as methylammonium ion), an amidinium ion such as formamidinium ion, or the like.

In the perovskite compound, B is a component positioned at the center of the hexahedron disposing A at each apex and the octahedron disposing X at each apex in the perovskite crystalline structure and represents a metal ion. The metal ion as the component B may be an ion composed of one or more selected from the group consisting of a monovalent metal ion, a divalent metal ion, and a trivalent metal ion. B preferably contains a divalent metal ion and more preferably contains one or more metal ions selected from the group consisting of lead and tin.

In the perovskite compound, X represents a component positioned at each apex of the octahedron including B as the center in the perovskite crystalline structure and represents one or more anions selected from the group consisting of a halide ion and a thiocyanate ion.

X can be appropriately selected according to the desired emission wavelength and is preferably appropriately selected from a chloride ion, a bromide ion, and an iodide ion, and the content ratio is preferably appropriately selected according to the emission wavelength. For example, X may be a combination of a bromide ion and a chloride ion or a combination of a bromide ion and an iodide ion.

The particles of the perovskite compound preferably have an average particle size of 1 nm or more, more preferably 2 nm or more, still more preferably 3 nm or more, from the viewpoint of well maintaining the crystalline structure, and preferably 10 μm or less, more preferably 1 μm or less, and still more preferably 500 nm or less, from the viewpoint of making the particles of the perovskite compound unlikely to settle down.

The above upper limit values and lower limit values may be arbitrarily combined.

The particles of the perovskite compound preferably have an average particle size of 1 nm or more and 10 μm or less, more preferably 2 nm or more and 1 μm or less, and still more preferably 3 nm or more and 500 nm or less, from the viewpoint of making the particles of the perovskite compound unlikely to settle down and the viewpoint of well maintaining the crystal structure.

The peak of the fluorescence of the perovskite compound is measured according to the measurement method described in the column of Examples described later.

Examples of the method for producing the particles of the perovskite compound include a method for producing including a step of dissolving the component B, the component X, and the component A in a solvent, thereby obtaining a solution, and a step of mixing the obtained solution and a solvent in which the solubility of the perovskite compound is lower than that in the solvent used in the step of obtaining the solution; and a method for producing including a step of adding and dissolving the component B, the component X, and the component A in a high-temperature solvent, thereby obtaining a solution, and a step of cooling the obtained solution.

[Substrate]

The substrate included in the color conversion layer (B) preferably has translucency from the viewpoint of extracting light at the time of light emission. As the substrate, for example, a thermoplastic resin film such as polyethylene terephthalate or a known material such as glass can be used. For example, in the color conversion layer (B), a layer containing a cured product of a quantum dot composition can be provided on a substrate.

[Barrier Layer]

In order to protect the layer containing the cured product of the quantum dot composition from water vapor in the outside air and air in the atmosphere, the color conversion layer (B) may include a barrier layer. The barrier layer is not particularly limited, but a barrier layer having translucency is preferable from the viewpoint of extracting emitted light, and a known barrier layer such as a polymer including polyethylene terephthalate, or a glass film can be applied.

[Light Scattering Layer]

The color conversion layer (B) may include a light scattering layer from the viewpoint of efficiently absorbing the incident light. The light scattering layer is not particularly limited, but a light scattering layer having translucency is preferable from the viewpoint of extracting emitted light, and a known light scattering layer such as light scattering particles including silica particles, or an amplified diffusion film can be applied.

[Method for Producing Color Conversion Layer]

Examples of the method for producing the color conversion layer (B) include a method for producing including a step of preparing a quantum dot composition, a step of applying the quantum dot composition to a substrate, and a step of removing a solvent; a method for producing including a step of preparing a film containing a cured product of a quantum dot composition and a step of laminating the obtained film to a substrate; and a method for producing including a step of preparing a quantum dot composition, a step of applying the quantum dot composition to a substrate, and a step of polymerizing a polymerizable compound.

As a method for coating the quantum dot composition on the substrate, known coating methods such as a gravure coating method, a bar coating method, a printing method, a spray method, a spin coating method, a dip method, and a die coating method can be used.

An arbitrary adhesive can be used in the step of laminating the film containing a cured product of the quantum dot composition on the substrate. The adhesive is not particularly limited as long as the quantum dots are not dissolved therein, and a known adhesive can be used.

The method for producing the color conversion layer (B) may be a production method including a step of further laminating an arbitrary film. Examples of the arbitrary film to be laminated include a barrier film, a light scattering film, a reflective film, and a diffusion film. An arbitrary adhesive can be used in the step of laminating an arbitrary film. The adhesive described above is not particularly limited as long as the quantum dots are not dissolved therein, and a known adhesive can be used.

[Quantum Dot Composition]

The color conversion layer (B) may be formed from the quantum dot composition described above. The quantum dot composition may contain the green fluorescent particles (B-g) described above, a solvent, and a polymerizable compound or a polymer in addition to quantum dots (B-r).

The content of the quantum dots (B-r) in the quantum dot composition is preferably 50% by mass or less, more preferably 5% by mass or less, and still more preferably 1% by mass or less, based on 100% by mass of the quantum dot composition. The content of the quantum dots (B-r) in the quantum dot composition is preferably 0.0001% by mass or more, more preferably 0.0005% by mass or more, and still more preferably 0.001% by mass or more, from the viewpoint of obtaining good emission intensity. The above upper limit values and lower limit values may be arbitrarily combined.

The content of the quantum dots (B-r) in the quantum dot composition is usually 0.0001% by mass or more and 50% by mass or less, preferably 0.0001% by mass or more and 5% by mass or less, and more preferably 0.0005% by mass or more and 2% by mass or less, based on 100% by mass of the quantum dot composition.

The composition in which the content of the quantum dots (B-r) in the quantum dot composition is within the above range is preferable in that aggregation of the quantum dots (D) is unlikely to occur and the light-emitting property is well exhibited.

When the quantum dot composition contains the perovskite fluorescent particles (B-g), the content of the perovskite fluorescent particles (B-g) in the quantum dot composition is, based on 100% by mass of the quantum dot composition, preferably 50% by mass or less, more preferably 5% by mass or less, and still more preferably 1% by mass or less, based on 100% by mass of a curable composition, from the viewpoint of making the fluorescent particles unlikely to aggregate and the viewpoint of preventing concentration quenching. The content of the perovskite fluorescent particles (B-g) in the quantum dot composition is preferably 0.0001% by mass or more, more preferably 0.001% by mass or more, and still more preferably 0.01% by mass or more, from the viewpoint of obtaining good emission intensity. The above upper limit values and lower limit values may be arbitrarily combined. When the quantum dot composition contains the perovskite fluorescent particles (B-g), the content of the perovskite fluorescent particles (B-g) in the quantum dot composition is usually 0.0001% by mass or more and 50% by mass or less, preferably 0.0001% by mass or more and 5% by mass or less, and more preferably 0.0005% by mass or more and 2% by mass or less, based on 100% by mass of the quantum dot composition.

The composition in which the content of the perovskite fluorescent particles (B-g) is within the above range is preferable in that aggregation of the perovskite fluorescent particles (B-g) is unlikely to occur and the light-emitting property is well exhibited.

[Solvent]

The solvent is a medium that is capable of dispersing the quantum dots (B-r) and is preferably a solvent that is unlikely to dissolve the quantum dots (B-r). The term "solvent" refers to a substance that takes a liquid state under 1 atm at 25° C. (excluding polymerizable compounds and polymers). The expression "being dispersed" refers to a state in which the quantum dots (B-r), the perovskite fluorescent particles (B-g), or the like are floating or suspended in a solvent, a polymerizable compound, a polymer, or the like, and a part of the quantum dots (B-r) or the perovskite fluorescent particles (B-g) may be settled down.

Examples of the solvent include esters such as methyl formate, ethyl formate, propyl formate, pentyl formate, methyl acetate, ethyl acetate, and pentyl acetate; ketones such as γ-butyrolactone, acetone, dimethyl ketone, diisobutyl ketone, cyclopentanone, cyclohexanone, and methylcyclohexanone; ethers such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifuloroethanol, and 2,2,3,3-tetrafluoro-1-propanol; glycol ethers such as ethylene glycol monomethyl ether, ethylene glycol monoethyl ether, ethylene glycol monobutyl ether, ethylene glycol monoethyl ether acetate, and triethylene glycol dimethyl ether; organic solvents having an amide group, such as N-methyl-2-pyrrolidone, N,N-dimethylformamide, acetamide, and N,N-dimethylacetamide; organic solvents having a nitrile group, such as acetonitrile, isobutyronitrile, propionitrile, and methoxyacetonitrile; organic solvents having a hydrocarbon group, such as ethylene carbonate and propylene carbonate; organic solvents having a halogenated hydrocarbon group, such as methylene chloride and chloroform; organic solvents having a hydrocarbon group, such as n-pentane, cyclohexane, n-hexane, benzene, toluene, and xylene; and dimethyl sulfoxide.

Of there, an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methylcyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, or phenetole; an organic solvent having a nitrile group, such as acetonitrile, isobutyronitrile, propionitrile, or methoxyacetonitrile; an organic solvent having a carbonate group, such as ethylene carbonate or propylene carbonate; an organic solvent having a halogenated hydrocarbon group, such as methylene chloride or chloroform; or an organic solvent having a hydrocarbon group, such as n-pentane, cyclohexane, n-hexane, benzene, toluene, or xylene is preferable because it has low polarity and is therefore considered to be unlikely to dissolve the quantum dots (B-r), and an organic solvent having a halogenated hydrocarbon group, such as methylene chloride or chloroform; or an organic solvent having a hydrocarbon group, such as n-pentane, cyclohexane, n-hexane, benzene, toluene, or xylene is more preferable.

When the quantum dot composition contains a solvent, the content of the solvent in the quantum dot composition may be, for example, 10 to 99.99% by mass, and is preferably 15 to 90% by mass, and more preferably 15 to 80% by mass.

[Polymerizable Compound or Polymer]

The polymerizable compound is not particularly limited and may be one, or two or more. As the polymerizable compound, a polymerizable compound in which the dispersibility of the quantum dots (B-r) is good at a temperature where the quantum dot composition is produced is preferable.

As used herein, the term "polymerizable compound" means a compound of a monomer having a polymerizable group. For example, when the quantum dot composition is produced under room temperature and normal pressure, the polymerizable compound is not particularly limited, and examples thereof include known polymerizable compounds such as styrene and methyl (meth)acrylate. Of these, any one or both of a (meth)acrylic ester and a methacrylic ester, which are monomer components for an acrylic resin, are preferable as the polymerizable compound.

As used herein, the term "(meth)acrylic acid" represents at least one selected from the group consisting of acrylic acid and methacrylic acid. Notations such as "(meth)acryloyl" and "(meth)acrylate" have the same meaning.

The polymer is not particularly limited and may be one, or two or more. As the polymer, a polymerizable compound in which the solubility of the quantum dots (B-r) is low at a temperature where the quantum dot composition is produced is preferable.

Examples thereof include known polymers such as polystyrene, (meth)acrylic resins, silicone, cycloolefin polymers, and polyesters. Of these, a cycloolefin polymer, a (meth)acrylic resin, or a polyester is preferable as the polymer from the viewpoint of higher transparency and efficient extraction of emitted light. The acrylic resin contains a structural unit derived from any one or both of an acrylic ester and a methacrylic ester.

The amount of the acrylic ester and/or the methacrylic ester and the structural units derived from these based on the total structural units contained in the polymerizable compound or the polymer, when expressed by mol %, may be 10% or more, 30% or more, 50% or more, 80% or more, or 100%, based on the total structural units.

When the quantum dot composition contains the polymerizable compound or the polymer, the content of the polymerizable compound or the polymer in the quantum dot composition is, for example, based on 100% by mass of solid content of the quantum dot composition, 5% by mass or more and 99% by mass or less, preferably 10% by mass or more and 99% by mass or less, more preferably 20% by mass or more and 99% by mass or less, still more preferably 40% by mass or more and 99% by mass or less, and further preferably 50% by mass or more and 99% by mass or less.

When the content of the polymerizable compound or the polymer is within the above range, the mechanical properties and the optical properties of the cured product of the quantum dot composition tend to be good. The solid content of the quantum dot composition means the total of all the components contained in the quantum dot composition excluding the solvent.

[Other Components]

Examples of the other components include a certain amount of impurities, and compounds which are composed of elemental components constituting the quantum dots (B-r) or the perovskite fluorescent particles (B-g) and have an amorphous structure, polymerization initiators, and inorganic compounds for forming a protective layer for the quantum dots (B-r). The content proportion of the other components is preferably 10% by mass or less, more preferably 5% by mass or less, and still more preferably 1% by mass or less, and still more preferably 1% by mass or less based on the total mass of the quantum dot composition.

The color conversion layer (B) can be disposed on the display device in a sealed form in a glass tube or the like, or in a sealed form sandwiched between two barrier films as a sheet.

<Color Filter (C)>

The color filter (C) has a blue color filter (C-b) that transmits blue color light (blue light), a green color filter (C-g) that transmits green color light (green light), and a red color filter (C-r) that transmits red color light (red light). White light emitted from the color conversion layer (B) is emitted from the display device as blue light, green light, and red light by transmitting through the blue color filter (C-b), the green color filter (C-g), and the red color filter (C-r), respectively.

The color filter (C) usually contains a colorant. The colorant may be a dye or a pigment. As the dye, known dyes can be used, and examples thereof include known dyes disclosed in "Color Index" (published by The Society of Dyers and Colourists) and "Dyeing Note" (SHIKISENSHA CO., LTD.). Further, according to the chemical structure, examples thereof include azo dyes, cyanine dyes, triphenylmethane dyes, xanthene dyes, anthraquinone dyes, naphthoquinone dyes, quinoneimine dyes, methine dyes, azomethine dyes, squarylium dyes, acridine dyes, styryl dyes, coumarin dyes, quinoline dyes, nitro dyes, phthalocyanine dyes, and perylene dyes. These dyes may be used singly or in combination of two or more kinds thereof.

Specific examples thereof include dyes having the following color index (C.I.) numbers:

C.I. Solvent dyes including:
C.I. Solvent Yellow 4, 14, 15, 23, 24, 25, 38, 62, 63, 68, 79, 81, 82, 83, 89, 94, 98, 99, 117, 162, 163, 167, and 189;
C.I. Solvent Red 24, 45, 49, 90, 91111, 118, 119, 122, 124, 125, 127, 130, 132, 143, 145, 146, 150, 151, 155, 160, 168, 169, 172, 175, 181, 207, 218, 222, 227, 230, 245, and 247;
C.I. Solvent Orange 2, 7, 11, 15, 26, 41, 54, 56, 77, 86, and 99;
C.I. Solvent Violet 11, 13, 14, 26, 31, 36, 37, 38, 45, 47, 48, 51, 59, and 60;
C.I. Solvent Blue 4, 5, 14, 18, 35, 36, 37, 38, 44, 45, 58, 59, 59:1, 63, 67, 68, 69, 70, 78, 79, 83, 90, 94, 97, 98, 100, 101, 102, 104, 105, 111, 112, 122, 128, 132, 136, and 139; and
C.I. Solvent Green 1, 3, 4, 5, 7, 28, 29, 32, 33, 34, and 35;
C.I. Acid dyes including:
C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, and 251;
C.I. Acid Red 1, 4, 8, 14, 17, 18, 26, 27, 29, 31, 33, 34, 35, 37, 40, 42, 44, 50, 51, 52, 57, 66, 73, 76, 80, 87, 88, 91, 92, 94, 95, 97, 98, 103, 106, 111, 114, 129, 133, 134, 138, 143, 145, 150, 151, 155, 158, 160, 172, 176, 182, 183, 195, 198, 206, 211, 215, 216, 217, 227, 228, 249, 252, 257, 258, 260, 261, 266, 268, 270, 274, 277, 280, 281, 289, 308, 312, 315, 316, 339, 341, 345, 346, 349, 382, 383, 388, 394, 401, 412, 417, 418, 422, and 426;
C.I. Acid Orange 6, 7, 8, 10, 12, 26, 50, 51, 52, 56, 62, 63, 64, 74, 75, 94, 95, 107, 108, 149, 162, 169, and 173;
C.I. Acid Violet 6B, 7, 9, 15, 16, 17, 19, 21, 23, 24, 25, 30, 34, 38, 49, 72, and 102;
C.I. Acid Blue 1, 3, 5, 7, 9, 11, 13, 15, 17, 18, 22, 23, 24, 25, 26, 27, 29, 34, 38, 40, 41, 42, 43, 45, 48, 51, 54, 59, 60, 62, 70, 72, 74, 75, 78, 80, 82, 83, 86, 87, 88, 90, 90:1, 91, 92, 93, 93:1, 96, 99, 100, 102, 103, 104, 108, 109, 110, 112, 113, 117, 119, 120, 123, 126, 127, 129, 130, 131, 138, 140, 142, 143, 147, 150, 151, 154, 158, 161, 166, 167, 168, 170, 171, 175, 182, 183, 184, 187, 192, 199, 203, 204, 205, 210, 213, 229, 234, 236, 242, 243, 249, 256, 259, 267, 269, 278, 280, 285, 290, 296, 315, 324:1, 335, and 340; and
C.I. Acid Green 1, 3, 5, 6, 7, 8, 9, 11, 13, 14, 15, 16, 22, 25, 27, 28, 41, 50, 50:1, 58, 63, 65, 80, 104, 105, 106, and 109;
C.I. Direct dyes including:
C.I. Direct Yellow 2, 4, 28, 33, 34, 35, 38, 39, 43, 44, 47, 50, 54, 58, 68, 69, 70, 71, 86, 93, 94, 95, 98, 102, 108, 109, 129, 132, 136, 138, and 141;
C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, and 250;
C.I. Direct Orange 26, 34, 39, 41, 46, 50, 52, 56, 57, 61, 64, 65, 68, 70, 96, 97, 106, and 107;
C.I. Direct Violet 47, 52, 54, 59, 60, 65, 66, 79, 80, 81, 82, 84, 89, 90, 93, 95, 96, 103, and 104;
C.I. Direct Blue 1, 2, 3, 6, 8, 15, 22, 25, 28, 29, 40, 41, 42, 47, 52, 55, 57, 71, 76, 77, 78, 80, 81, 84, 85, 86, 87, 90, 93, 94, 95, 97, 98, 99, 100, 101, 106, 107, 108, 109, 113, 114, 115, 117, 119, 120, 137, 149, 150, 153, 155, 156, 158, 159, 160, 161, 162, 163, 164, 165, 166, 167, 168, 170, 171, 172, 173, 188, 189, 190, 192, 193, 194, 195, 196, 198, 199, 200, 201, 202, 203, 207, 209, 210, 212, 213, 214, 222, 225, 226, 228, 229, 236, 237, 238, 242, 243, 244, 245, 246, 247, 248, 249, 250, 251, 252, 256, 257, 259, 260, 268, 274, 275, and 293; and
C.I. Direct Green 25, 27, 31, 32, 34, 37, 63, 65, 66, 67, 68, 69, 72, 79, and 82;
C.I. Disperse dyes including:
C.I. Disperse Yellow 51, 54, and 76;
C.I. Disperse Violet 26 and 27; and
C.I. Disperse Blue 1, 14, 56, and 60;
C.I. Basic dyes including:
C.I. Basic Red 1 and 10;
C.I. Basic Blue 1, 3, 5, 7, 9, 19, 21, 22, 24, 25, 26, 28, 29, 40, 41, 45, 47, 54, 58, 59, 60, 64, 65, 66, 67, 68, 81, 83, 88, and 89;
C.I. Basic Violet 2;
C.I. Basic Red 9; and
C.I. Basic Green 1;
C.I. Reactive dyes including:
C.I. Reactive Yellow 2, 76, and 116;
C.I. Reactive Orange 16; and
C.I. Reactive Red 36;
C.I. Mordant dyes including:
C.I. Mordant Yellow 5, 8, 10, 16, 20, 26, 30, 31, 33, 42, 43, 45, 56, 61, 62, and 65;
C.I. Mordant red 1, 2, 3, 4, 9, 11, 12, 14, 17, 18, 19, 22, 23, 24, 25, 26, 27, 29, 30, 32, 33, 36, 37, 38, 39, 41, 42, 43, 45, 46, 48, 52, 53, 56, 62, 63, 71, 74, 76, 78, 85, 86, 88, 90, 94, and 95;
C.I. Mordant Orange 3, 4, 5, 8, 12, 13, 14, 20, 21, 23, 24, 28, 29, 32, 34, 35, 36, 37, 42, 43, 47, and 48;
C.I. Mordant Violet 1, 1: 1, 2, 3, 4, 5, 6, 7, 8, 10, 11, 14, 15, 16, 17, 18, 19, 21, 22, 23, 24, 27, 28, 30, 31, 32, 33, 36, 37, 39, 40, 41, 44, 45, 47, 48, 49, 53, and 58;
C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, and 84; and
C.I. Mordant Green 1, 3, 4, 5, 10, 13, 15, 19, 21, 23, 26, 29, 31, 33, 34, 35, 41, 43, and 53; and
C.I. Vat dyes including C.I. Vat Green 1.

Examples thereof further include BASF's products, Lumogen®, including Lumogen® F Yellow 083 (manufactured by BASF Japan Ltd.), Lumogen® F Yellow 170 (manufactured by BASF Japan Ltd.), Lumogen® F Orange 240 (manufactured by BASF Japan Ltd.) and Lumogen® F Red 305 (manufactured by BASF Japan Ltd.).

As the pigment, known pigments can be used, and examples thereof include pigments classified as pigments in "Color Index" (published by The Society of Dyers and Colourists). These may be used singly or in combination of two or more kinds thereof.

Specific examples thereof include yellow pigments such as C.I. Pigment Yellow 1, 3, 12, 13, 14, 15, 16, 17, 20, 24, 31, 53, 83, 86, 93, 94, 109, 110, 117, 125, 128, 129, 137, 138, 139, 147, 148, 150, 153, 154, 166, 173, 185, 194, 214, and 231;

orange pigments such as C.I. Pigment Orange 13, 31, 36, 38, 40, 42, 43, 51, 55, 59, 61, 64, 65, 71, and 73;

red pigments such as C.I. Pigment Red 9, 97, 105, 122, 123, 144, 149, 166, 168, 176, 177, 178, 179, 180, 190, 192, 209, 215, 216, 224, 242, 254, 255, 264, 265, 266, 268, 269, and 273;

blue pigments such as C.I. Pigment Blue 15, 15:1, 15:2, 15:3, 15:4, 15:6, 16, and 60;

violet pigments such as C.I. Pigment Violet 1, 19, 23, 29, 32, 36, and 38;

green pigments such as C.I. Pigment Green 7, 36, 58, 59, 62, and 63;

brown pigments such as C.I. Pigment Brown 23 and 25; and black pigments such as C.I. Pigment Black 1, 7, 31, and 32.

Examples of the colorant include, in terms of chemical structure, perylene yellow dyes, quinophthalone yellow pigments, metal-containing yellow pigments, isoindoline yellow pigments, perylene orange dyes, perylene orange pigments, perylene red dyes, perylene red pigments, phthalocyanine pigments, halogenated copper phthalocyanine pigments, halogenated zinc phthalocyanine pigments, halogenated aluminum zinc phthalocyanine pigments, and brominated diketopyrrolopyrrole pigments.

The blue color filter (C-b) can contain at least one of the above colorants, a dye and a pigment of which hue is classified as blue. The colorant contained in the blue color filter (C-b) is preferably a blue pigment, and more preferably C.I. Pigment Blue 15, 15:3, 15:4, 15:6, 16, and 60, more preferably C.I. Pigment Blue 15:6.

The green color filter (C-g) can contain at least one of the above colorants, a dye and a pigment of which hue is classified as green. The colorant contained in the green color filter (C-g) is preferably a combination of a green pigment and a yellow pigment, more preferably a combination of at least one selected from the group consisting of C.I. Pigment Green 7, 36, 58, 59, 62, and 63, and at least one selected from the group consisting of C.I. Pigment yellow 1, 3, 12, 13, 14, 15, 16, 17, 20, 24, 31, 53, 83, 86, 93, 94, 109, 110, 117, 125, 128, 129, 137, 138, 139, 147, 148, 150, 153, 154, 166, 173, 185, 194, 214, and 231, and still more preferably a combination of C.I. Pigment Green 58 and C. I. Pigment Yellow 150.

The red color filter (C-r) can contain at least one of the above colorants, a dye and a pigment of which hue is classified as red. The colorant contained in the red color filter (C-r) is preferably a red pigment, and more preferably brominated diketopyrrolopyrrole pigment or the like.

[Method for Producing Color Filter (C)]

The color filter (C) can be produced as the color filter (C) having the blue color filter (C-b), the green color filter (C-g), and the red color filter (C-r) by, for example, forming a blue pattern, a green pattern, and a red pattern (hereinafter, collectively referred to as colored patterns) on a substrate from a blue curable resin composition, a green curable resin composition, and a red curable resin composition (hereinafter, collectively referred to as coloring curable resin composition), respectively.

Examples of the method for forming a colored pattern from the coloring curable resin composition include a photolithography method, an inkjet method, and a printing method, and a photolithography method is preferable. The photolithography method is a method in which a coloring curable resin composition is applied to a substrate, dried to form a coloring composition layer, and the coloring composition layer is developed by exposing the coloring composition layer to light through a photomask. In the photolithography method, the photomask is not used during the exposure to light, and/or the coloring composition layer is not developed, whereby a colored coating film which is a cured product of the coloring composition layer can be formed. The colored pattern and the colored coating film which have been formed from the coloring curable resin composition are the color filter (C) of the present invention.

The film thickness of the prepared color filter (C) is not particularly limited, and can be appropriately adjusted according to the purpose, application, and the like, and is, for example, 0.1 to 30 µm, preferably 0.1 to 20 µm, and more preferably 0.5 to 6 µm. The film thickness of the color filter may be, for example, less than 3.5 µm.

Examples of the substrate include a glass plate made from, for example, quartz glass, borosilicate glass, alumina silicate glass, soda lime glass of which the surface is coated with silica, or the like; a resin plate made from, for example, polycarbonate, polymethyl methacrylate, polyethylene terephthalate or the like; a substrate made from silicon; and a substrate produced by forming a thin film made from aluminum, silver or a silver/copper/palladium alloy or the like on a substrate. Another color filter layer, a resin layer, a transistor, a circuit, or the like may be formed on these substrates. The substrate may be included in the color filter (C).

The formation of the colored pattern using a photolithography method can be carried out using a known or conventional device or under known or conventional conditions. For example, the colored pattern can be prepared in the following manner.

First, the coloring curable resin composition is applied onto a substrate, and then dried by heat-drying (prebaking) and/or drying under reduced pressure to remove volatile components such as a solvent, thereby obtaining a smooth coloring curable resin composition layer.

Examples of the coating method include a spin coating method, a slit coating method, and a slit and spin coating method.

The temperature to be employed in the case where heat-drying is carried out is preferably 30 to 120° C. or less, more preferably 50° C. to 110° C. The heating time is preferably 10 seconds to 60 minutes, and more preferably 30 seconds to 30 minutes. In the case where drying under reduced pressure is carried out, it is preferred to carry out the drying procedure under a pressure of 50 to 150 Pa in a temperature range of 20 to 25° C. The film thickness of the coloring curable resin composition layer is not particularly limited, and may be appropriately selected depending on the target film thickness of the color filter.

Next, the coloring curable resin composition layer is exposed to light through a photomask for forming a desired colored pattern.

The pattern on the photomask is not particularly limited, and a pattern according to the intended application is used. The light sources used for exposure are preferably a light source that emits light having a wavelength of 250 to 450 nm. For example, light having a wavelength of shorter than 350 nm may be cut with a filter capable of cutting light having this wavelength region, or light having a wavelength in the vicinity of 436 nm, in the vicinity of 408 nm, or in the vicinity of 365 nm may be extracted selectively with a band-pass filter capable of extracting light having those wavelength region. Specific examples of the light source include a mercury lamp, a light-emitting diode, a metal halide lamp, and a halogen lamp.

A light-exposing device such as a mask aligner and a stepper is preferably used because the device is capable of emitting a parallel light beam uniformly over the whole area of the exposed surface or aligning the photomask accurately to the substrate which has the coloring curable resin composition layer formed thereon.

A colored pattern is formed on the substrate by bringing the exposed coloring curable resin composition layer into contact with a developer to develop the coloring curable resin composition layer. By developing, an unexposed portion in the coloring curable resin composition layer is dissolved in the developer and therefore removed.

The developer is preferably an aqueous solution of an alkaline compound such as potassium hydroxide, sodium hydrogen carbonate, sodium carbonate, and tetramethylammonium hydroxide.

The concentration of the alkaline compound is preferably 0.01 to 10% by mass, and more preferably 0.02 to 5% by mass. The developer may contain a surfactant. The developing method may be any of a paddle method, a dipping method, a spray method and the like. Further, the substrate may be inclined at any degree during development.

The developed substrate is preferably washed with water.

Furthermore, the resultant colored pattern is preferably subjected to post-baking.

The post-baking temperature is preferably 150 to 250° C., and more preferably 160 to 235° C. The post-baking time is preferably 1 to 120 minutes, and more preferably 10 to 60 minutes. The thus obtained color filter which is a colored pattern or a colored coating film may be further subjected to a surface coating treatment in order to impart various characteristics.

[Coloring Curable Resin Composition]

The coloring curable resin composition contains a resin (B), a polymerizable compound (C), and a polymerization initiator (D) in addition to the colorant described above (hereinafter, also referred to as colorant (A)).

The content ratio of the solid content in the coloring curable resin composition is 100% by mass or less, preferably 0.01% by mass or more and 100% by mass or less, more preferably 0.1% by mass or more and 99.9% by mass or less, still more preferably 0.1% by mass or more and 99% by mass or less, further preferably 1% by mass or more and 90% by mass or less, even further preferably 1% by mass or more and 80% or less, particularly preferably 1% by mass or more and 70% or less, extremely preferably 1% by mass or more and 60% or less, and most preferably 1% by mass or more and 50% by mass or less, based on the total amount of the coloring curable composition. As used herein, "the total amount of the solid content" means the total amount of the components excluding the solvent (E) from the coloring curable resin composition. The total amount of solid content and the content of each component can be measured by a known analytical means such as liquid chromatography or gas chromatography.

The content ratio of the colorant (A) in the coloring curable resin composition may be, for example, based on the total amount of the solid content, 1% by mass or more and 99% by mass or less, and is preferably 1% by mass or more and 90% by mass or less, more preferably 1% by mass or more and 80% by mass or less, still more preferably 1% by mass or more and 70% by mass or less, further preferably 1% by mass or more and 60% by mass or less, even further preferably 1% by mass or more and 55% by mass or less, particularly preferably 5% by mass or more and 55% by mass or less, and extremely preferably 10% by mass or more and 55% by mass or less. In a preferred aspect of the present invention, the content ratio of the colorant (A) in the coloring curable resin composition may be, for example, based on the total amount of the solid content, 12% by mass or more and 80% by mass or less, preferably 15% by mass or more and 70% by mass or less, and still more preferably 20% by mass or more and 50% by mass or less.

[Resin (B)]

The resin (B) is preferably an alkali-soluble resin, and more preferably a polymer having a structural unit derived from at least one monomer (hereinafter, also referred to as "monomer (a)") selected from the group consisting of an unsaturated carboxylic acid and an unsaturated carboxylic acid anhydride.

The resin (B) is preferably a copolymer having a structural unit derived from a monomer (hereinafter, also referred to as "monomer (b)") having a cyclic ether structure having 2 to 4 carbon atoms and an ethylenically unsaturated bond and other structural units.

Examples of other structural units include a structural unit derived from a monomer (hereinafter, also referred to as "monomer (c)") copolymerizable with the monomer (a) (but different from the monomer (a) and the monomer (b)) and a structural unit derived from an ethylenically unsaturated bond.

Examples of the monomer (a) include unsaturated monocarboxylic acids such as acrylic acid, methacrylic acid, crotonic acid, and o-, m-, and p-vinylbenzoic acid;

unsaturated dicarboxylic acids such as maleic acid, fumaric acid, citraconic acid, mesaconic acid, itaconic acid, 3-vinylphthalic acid, 4-vinylphthalic acid, 3,4,5,6-tetrahydrophthalic acid, 1,2,3,6-tetrahydrophthalic acid, dimethyltetrahydrophthalic acid, and 1,4-cyclohexenedicarboxylic acid;

bicyclo unsaturated compounds containing a carboxy group, such as methyl-5-norbornene-2,3-dicarboxylic acid, 5-carboxybicyclo[2.2.1]hept-2-ene, 5,6-dicarboxybicyclo[2.2.1]hept-2-ene, 5-carboxy-5-methylbicyclo[2.2.1]hept-2-ene, 5-carboxy-5-ethylbicyclo[2.2.1]hept-2-ene, 5-carboxy-6-methylbicyclo[2.2.1]hept-2-ene, and 5-carboxy-6-ethylbicyclo[2.2.1]hept-2-ene;

unsaturated dicarboxylic acid anhydrides such as maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, and 5,6-dicarboxybicyclo[2.2.1]hept-2-ene anhydride;

unsaturated mono[(meth)acryloyloxyalkyl]esters of di- or higher polycarboxylic acids such as mono[2-(meth)acryloyloxyethyl]succinate and mono[2-(meth)acryloyloxyethyl]phthalate; and unsaturated acrylates containing a hydroxy group and a carboxy group in the same molecule, such as α-(hydroxymethyl)acrylic acid.

Of these, acrylic acid, methacrylic acid, maleic anhydride and the like are preferable from the viewpoint of copolymerization reactivity and solubility of the obtained resin in an alkaline aqueous solution.

The monomer (b) means a polymerizable compound having a cyclic ether structure having 2 to 4 carbon atoms (for example, at least one selected from the group consisting of an oxirane ring, an oxetane ring, and a tetrahydrofuran ring) and an ethylenically unsaturated bond.

The monomer (b) is preferably a monomer having a cyclic ether structure having 2 to 4 carbon atoms and a (meth)acryloyloxy group.

Examples of the monomer (b) include a monomer) (hereinafter, also referred to as "monomer (b1)") having an oxiranyl group and an ethylenically unsaturated bond, a monomer (hereinafter, also referred to as "monomer (b2)") having an oxetanyl group and an ethylenically unsaturated bond, and a monomer (hereinafter, also referred to as "monomer (b3)") having a tetrahydrofuryl group and an ethylenically unsaturated bond.

Examples of the monomer (b1) include a monomer (hereinafter, also referred to as "monomer (b1-1)") having a structure in which a linear or branched aliphatic unsaturated hydrocarbon has been epoxidized and a monomer (hereinafter, also referred to as "monomer (b1-2)") having a structure in which an alicyclic unsaturated hydrocarbon has been epoxidized.

The monomer (b1-1) is preferably a monomer having a glycidyl group and an ethylenically unsaturated bond.

Examples of the monomer (b1-1) include glycidyl (meth)acrylate, β-methylglycidyl (meth)acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-bis(glycidyloxymethyl)styrene, 2,4-bis(glycidyloxymethyl)styrene, 2,5-bis(glycidyloxymethyl) styrene, 2,6-bis(glycidyloxymethyl)styrene, 2,3,4-tris(glycidyloxymethyl) styrene, 2,3,5-tris(glycidyloxymethyl)styrene, 2,3,6-tris(glycidyloxymethyl) styrene, 3,4,5-tris(glycidyloxymethyl)styrene, and 2,4,6-tris(glycidyloxymethyl) styrene.

Examples of the monomer (b1-2) include vinylcyclohexene monoxide, 1,2-epoxy-4-vinylcyclohexane (for example, CELLOXIDE® 2000; manufactured by Daicel Corporation), 3,4-epoxycyclohexylmethyl (meth)acrylate, (for example, CYCLOMER® A400; manufactured by Daicel Corporation), 3,4-epoxycyclohexylmethyl (meth)acrylate, (for example, CYCLOMER® M100; manufactured by Daicel Corporation), a compound represented by the formula (BI), and a compound represented by the formula (BII).

[Formula 3]

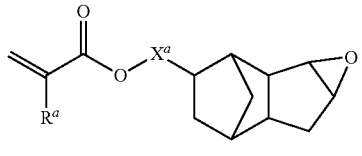

(BI)

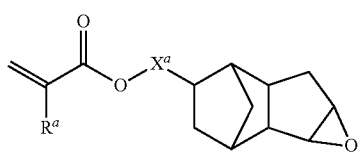

(BII)

[In the formula (BI) and the formula (BII), $R^a$ and $R^b$ each independently represent a hydrogen atom or an alkyl group having 1 to 4 carbon atoms, and a hydrogen atom contained in the alkyl group is optionally substituted with a hydroxy group.

$X^a$ and $X^b$ each independently represent a single bond, *—$R^c$—, *—$R^c$—O—, *—$R^c$—S—, or *—$R^c$—NH—.

$R^c$ represents an alkanediyl group having 1 to 6 carbon atoms.

* represents a bond with O.]

Examples of the alkyl group having 1 to 4 carbon atoms include a methyl group, an ethyl group, an n-propyl group, an isopropyl group, an n-butyl group, a sec-butyl group, and a tert-butyl group.

Examples of the alkyl group in which a hydrogen atom is substituted with hydroxy include a hydroxymethyl group, a 1-hydroxyethyl group, a 2-hydroxyethyl group, a 1-hydroxypropyl group, a 2-hydroxypropyl group, a 3-hydroxypropyl group, a 1-hydroxy-1-methylethyl group, a 2-hydroxy-1-methylethyl group, a 1-hydroxybutyl group, a 2-hydroxybutyl group, a 3-hydroxybutyl group, and a 4-hydroxybutyl group.

Preferred examples of $R^a$ and $R^b$ include a hydrogen atom, a methyl group, a hydroxymethyl group, 1-hydroxyethyl group, and 2-hydroxyethyl group, and more preferred examples thereof include a hydrogen atom and a methyl group.

Examples of the alkanediyl group include a methylene group, an ethylene group, a propane-1,2-diyl group, a propane-1,3-diyl group, a butane-1,4-diyl group, a pentane-1,5-diyl group, and a hexane-1,6-diyl group.

Preferred examples of $X^a$ and $X^b$ include a single bond, a methylene group, an ethylene group, *—$CH_2$—O—, and *$CH_2CH_2$—O—, and more preferred examples thereof include a single bond and *—$CH_2CH_2$—O— (* represents a bond with O).

Examples of the compound represented by the formula (BI) include a compound represented by any one of the formula (BI-1) to the formula (BI-15). Of these, the compounds represented by the formula (BI-1), the formula (BI-3), the formula (BI-5), the formula (BI-7), the formula (BI-9), and the formula (BI-11) to the formula (BI-15) are preferable, and the compounds represented by the formula (BI-1), the formula (BI-7), the formula (BI-9), and the formula (BI-15) are more preferable.

[Formula 4]

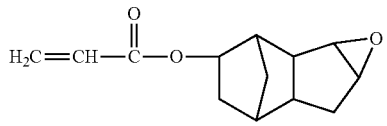

(BI-1)

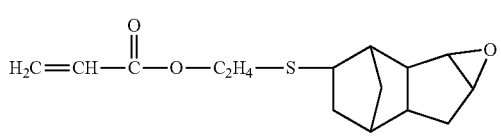

(BI-2)

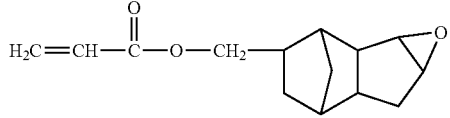

(BI-3)

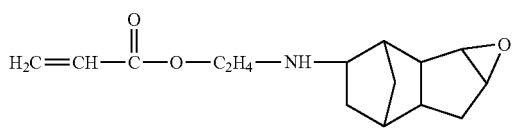

(BI-4)

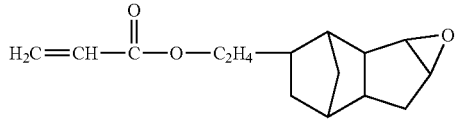

(BI-5)

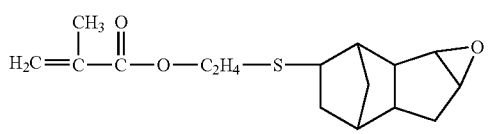

(BI-6)

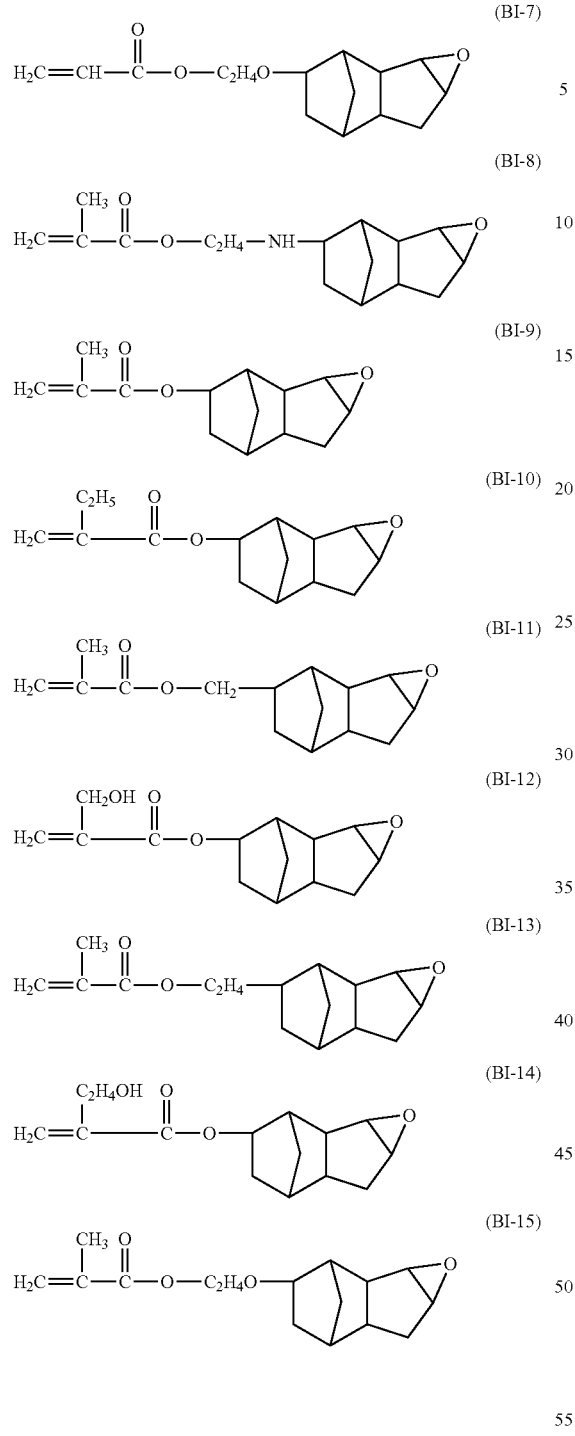
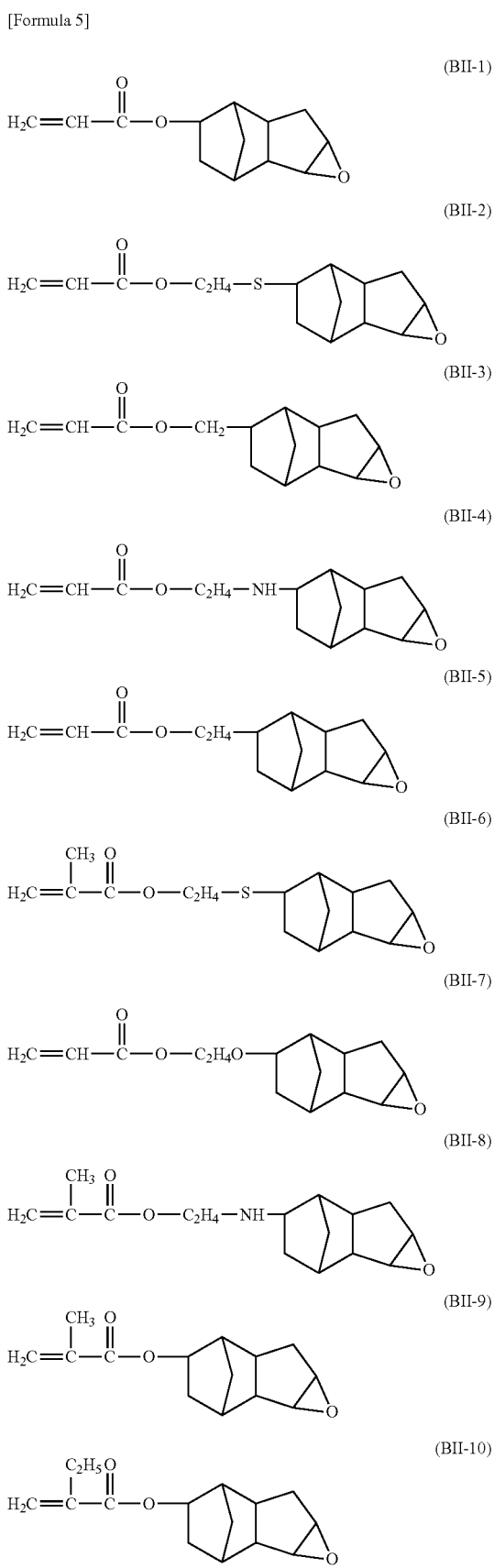

Examples of the compound represented by the formula (BII) include a compound represented by any one of the formula (BII-1) to the formula (BII-15), and of these, preferred examples thereof include the compounds represented by the formula (BII-1), the formula (BII-3), the formula (BII-5), the formula (BII-7), the formula (BII-9), and the formula (BII-11) to the formula (BII-15), and more preferred examples thereof include the compounds represented by the formula (BII-1), the formula (BII-7), the formula (BII-9), and the formula (BII-15).

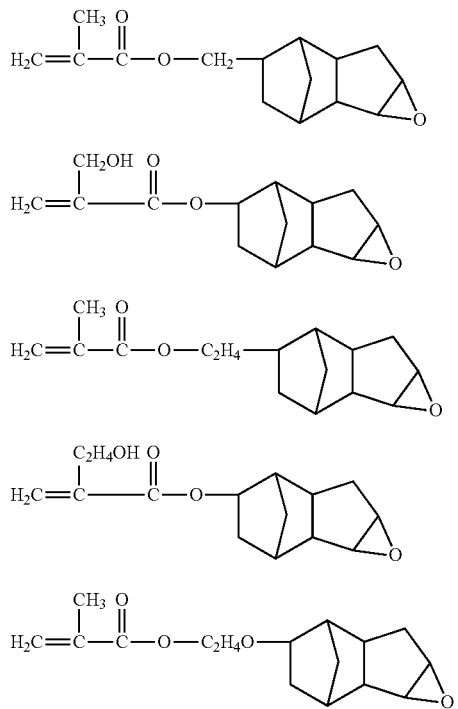

The compound represented by the formula (BI) and the compound represented by the formula (BII) may be each used singly or in combination of two or more kinds thereof. The compound represented by the formula (BI) and the compound represented by the formula (BII) may be used in combination. When the compound represented by the formula (BI) and the compound represented by the formula (B2) are used in combination, the content ratio of these [the compound represented by the formula (BI):the compound represented by the formula B(II)] is preferably 5:95 to 95:5, more preferably 10:90 to 90:10, and still more preferably 20:80 to 80:20, on a molar basis.

The monomer (b2) is more preferably a monomer having an oxetanyl group and a (meth)acryloyloxy group.

Examples of the monomer (b2) include 3-methyl-3-methacrylolyoxymethyloxetane, 3-methyl-3-acryloyloxymethyloxetane, 3-ethyl-3-methacryloyloxymethyloxetane, 3-ethyl-3-acryloyloxymethyloxetane, 3-methyl-3-methacryloyloxyethyloxetane, 3-methyl-3-acryloyloxyethyloxetane, 3-ethyl-3-methacryloyloxyethyloxetane, and 3-ethyl-3-acryloyloxyethyloxetane.

The monomer (b3) is more preferably a monomer having a tetrahydrofuryl group and a (meth)acryloyloxy group.

Examples of the monomer (b3) include tetrahydrofurfuryl acrylate (for example, Viscoat V #150, manufactured by OSAKA ORGANIC CHEMICAL INDUSTRY LTD.) and tetrahydrofurfuryl methacrylate.

The monomer (b) is preferably a monomer (b1) from the viewpoint of capable of further enhancing the reliability such as the heat resistance and chemical resistance of the obtained color filter. Further, the monomer (b) is more preferably a monomer (b1-2) from the viewpoint of being excellent in the storage stability of the coloring curable resin composition.

Examples of the monomer (c) include (meth)acrylic esters such as methyl (meth)acrylate, ethyl (meth)acrylate, n-butyl (meth)acrylate, sec-butyl (meth)acrylate, tert-butyl (meth)acrylate, 2-ethylhexyl (meth)acrylate, dodecyl (meth)acrylate, lauryl (meth)acrylate, stearyl (meth)acrylate, cyclopentyl (meth)acrylate, cyclohexyl (meth)acrylate, 2-methylcyclohexyl (meth)acrylate, tricyclo[$5.2.1.0^{2,6}$]decan-8-yl (meth)acrylate, tricyclo[$5.2.1.0^{2,6}$]decan-9-yl (meth)acrylate, tricyclo[$5.2.1.0^{2,6}$]decen-8-yl (meth)acrylate, tricyclo[$5.2.1.0^{2,6}$]decen-9-yl (meth)acrylate, dicyclopentanyloxyethyl (meth)acrylate, isobornyl (meth)acrylate, adamantyl (meth)acrylate, allyl (meth)acrylate, propargyl (meth)acrylate, phenyl (meth)acrylate, naphthyl (meth)acrylate, and benzyl (meth)acrylate;

hydroxy group-containing (meth)acrylic esters such as 2-hydroxyethyl (meth)acrylate and 2-hydroxypropyl (meth)acrylate;

dicarboxylic diesters such as diethyl maleate, diethyl fumarate, and diethyl itaconate;

bicyclo unsaturated compounds such as bicyclo[2.2.1]hept-2-ene, 5-methylbicyclo[2.2.1]hept-2-ene, 5-ethylbicyclo[2.2.1]hept-2-ene, 5-hydroxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo[2.2.1]hept-2-ene, 5-ethoxybicyclo[2.2.1]hept-2-ene, 5,6-dihydroxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo[2.2.1]hept-2-ene, 5-hydroxymethyl-5-methylbicyclo[2.2.1]hept-2-ene, 5-tert-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-bis(tert-butoxycarbonyl)bicyclo[2.2.1]hept-2-ene, and 5,6-bis(cyclohexyloxycarbonyl)bicyclo[2.2.1]hept-2-ene; dicarbonylimide derivatives such as N-phenylmaleimide, N-cyclohexylmaleimide, N-benzylmaleimide, N-succinimidyl-3-maleimidobenzoate, N-succinimidyl-4-maleimidobutyrate, N-succinimidyl-6-maleimide caproate, N-succinimidyl-3-maleimide propionate, and N-(9-acridinyl)maleimide;

vinyl group-containing aromatic compounds such as styrene, o-methylstyrene, m-methylstyrene, p-methylstyrene, vinyltoluene, and p-methoxystyrene; vinyl group-containing nitriles such as (meth)acrylonitrile; halogenated hydrocarbons such as vinyl chloride and vinylidene chloride; vinyl group-containing amides such as (meth)acrylamide; esters such as vinyl acetate; and dienes such as 1,3-butadiene, isoprene, and 2,3-dimethyl-1,3-butadiene.

Among these, from the viewpoint of copolymerization reactivity and heat resistance, styrene, vinyltoluene, tricyclo[$5.2.1.0^{2,6}$]decan-8-yl (meth)acrylate, tricyclo[$5.2.1.0^{2,6}$]decan-9-yl (meth)acrylate, tricyclo[$5.2.1.0^{2,6}$]decen-8-yl (meth)acrylate, tricyclo[$5.2.1.0^{2,6}$]decen-9-yl (meth)acrylate, N-phenylmaleimide, N-cyclohexylmaleimide, N-benzylmaleimide, bicyclo[2.2.1]hept-2-ene, benzyl (meth)acrylate, 2-hydroxyethyl (meth)acrylate, 2-ethylhexyl (meth)acrylate, and the like are preferable.

Specific examples of the resin (B) include a 3,4-epoxycyclohexylmethyl (meth)acrylate/(meth)acrylic acid copolymer, a 3,4-epoxytricyclo[$5.2.1.0^{2,6}$]decyl (meth)acrylate/(meth)acrylic acid copolymer, a glycidyl (meth)acrylate/benzyl (meth)acrylate/(meth)acrylic acid copolymer, a glycidyl (meth)acrylate/styrene/(meth)acrylic acid copolymer, a 3,4-epoxytricyclo[$5.2.1.0^{2,6}$]decyl (meth)acrylate/(meth)acrylic acid/N-cyclohexylmaleimide copolymer, a 3,4-epoxytricyclo[5.2.1.0$^{2,6}$]decyl (meth)acrylate/(meth)acrylic acid/N-cyclohexylmaleimide/2-hydroxyethyl (meth)acrylate copolymer, a 3,4-epoxytricyclo[5.2.1.0$^{2,6}$]decyl (meth)acrylate/(meth)acrylic acid/vinyltoluene copolymer, a 3,4-epoxytricyclo[5.2.1.0$^{2,6}$]decyl (meth)acrylate/(meth)acrylic acid/2-ethylhexyl (meth)acrylate copolymer, a 3,4-epoxytricyclo[5.2.1.0$^{2,6}$]decyl(meth) acrylate/tricyclo[5.2.1.0$^{2,6}$]decenyl (meth)acrylate/(meth)acrylic acid/N-cyclohexylmaleimide copolymer, a 3-methyl-3-(meth)acryloyloxymethyloxetane/(meth)acrylic acid/styrene copolymer, a benzyl (meth)acrylate/(meth)acrylic acid copolymer, a styrene/(meth)acrylic acid copolymer, and resins disclosed in Japanese Patent Laid-Open No. 9-106071, Japanese Patent Laid-Open No. 2004-29518, and Japanese Patent Laid-Open No. 2004-361455.

In particular, the resin (B) is preferably a copolymer containing a structural unit derived from the monomer (a) and a structural unit derived from the monomer (b).

Two or more kinds of the resins (B) may be combined, and in this case, at least, the resin (B) preferably contains at least one copolymer containing a structural unit derived from the monomer (a) and a structural unit derived from the monomer (b), more preferably contains at least one copolymer containing a structural unit derived from the monomer (a) and a structural unit derived from the monomer (b1), still more preferably contains at least one copolymer containing a structural unit derived from the monomer (a) and a structural unit derived from the monomer (b1-2), and further preferably contains one or more selected from a 3,4-epoxytricyclo[5.2.1.0$^{2,6}$]decyl (meth)acrylate/(meth)acrylic acid copolymer, a 3,4-epoxytricyclo[5.2.1.0$^{2,6}$]decyl (meth)acrylate/(meth)acrylic acid/N-cyclohexylmaleimide/2-hydroxyethyl (meth)acrylate copolymer, a 3,4-epoxytricyclo[5.2.1.0$^{2,6}$]decyl (meth)acrylate/(meth)acrylic acid/vinyltoluene copolymer, and a 3,4-epoxytricyclo[5.2.1.0$^{2,6}$]decyl (meth)acrylate/(meth)acrylic acid/2-ethylhexyl (meth)acrylate copolymer.

The weight-average molecular weight (Mw) of the resin (B) in terms of polystyrene is preferably 1,000 to 100,000, more preferably 1,000 to 50,000, still more preferably 1,000 to 30,000, further preferably 3000 to 30000, and particularly preferably 5,000 to 30,000.

The degree of dispersion [weight-average molecular weight (Mw)/number-average molecular weight] of the resin (B) is preferably 1 to 6, more preferably 1 to 5, and still more preferably 1 to 4.

The acid value (in terms of solid content) of the resin (B) is preferably 10 to 500 mg-KOH/g, more preferably 20 to 450 mg-KOH/g, still more preferably 20 to 400 mg-KOH/g, even still more preferably 20 to 370 mg-KOH/g, still even further preferably 30 to 370 mg-KOH/g, yet still even further preferably 30 to 350 mg-KOH/g, particularly preferably 30 to 340 mg-KOH/g, and most preferably 30 to 335 mg-KOH/g. Here, the acid value is a value measured as the amount (mg) of potassium hydroxide necessary for neutralizing 1 g of the resin (B), and can be obtained by titrating with, for example, an aqueous potassium hydroxide solution.

The content ratio of the resin (B) in the coloring curable resin composition is less than 100% by mass based on the total amount of the solid content. In a preferred aspect of the present invention, the content ratio of the resin (B) in the coloring curable resin composition may be, for example, based on the total amount of the solid content, 1% by mass or more and 30% by mass or less, preferably 2% by mass or more and 25% by mass or less, and more preferably 4% by mass or more and 20% by mass or less.

[Polymerizable Compound (C)]

The polymerizable compound (C) is a compound that can be polymerizable by an active radical and/or an acid generated from a polymerization initiator (D), and is, for example, a compound having a polymerizable ethylenically unsaturated bond, preferably a (meth)acrylate compound.

Examples of the polymerizable compound having one ethylenically unsaturated bond include nonylphenyl carbitol acrylate, 2-hydroxy-3-phenoxypropyl acrylate, 2-ethylhexyl carbitol acrylate, 2-hydroxyethyl acrylate, and N-vinylpyrrolidone, and the monomer (a), monomer (b), and monomer (c) described above.

Examples of the polymerizable compound having two ethylenically unsaturated bonds include 1,6-hexanediol di(meth)acrylate, ethylene glycol di(meth)acrylate, neopentyl glycol di(meth)acrylate, triethylene glycol di(meth)acrylate, bisphenol A bis(acryloyloxyethyl)ether, and 3-methylpentanediol di(meth)acrylate.

In particular, the polymerizable compound (C) is preferably a polymerizable compound having three or more ethylenically unsaturated bonds. Examples of such a polymerizable compound include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta(meth)acrylate, tetrapentaerythritol deca(meth)acrylate, tetrapentaerythritol nona(meth)acrylate, tris(2-(meth)acryloyloxyethyl)isocyanurate, ethylene glycol-modified pentaerythritol tetra(meth)acrylate, ethylene glycol-modified dipentaerythritol hexa(meth)acrylate, propylene glycol-modified pentaerythritol tetra(meth)acrylate, propylene glycol-modified dipentaerythritol hexa(meth)acrylate, caprolactone-modified pentaerythritol tetra(meth)acrylate, and caprolactone-modified dipentaerythritol hexa(meth)acrylate, and preferred examples thereof include dipentaerythritol penta(meth)acrylate and dipentaerythritol hexa(meth)acrylate.

The weight-average molecular weight of the polymerizable compound (C) is preferably 50 or more and 4000 or less, more preferably 50 or more and 3500 or less, still more preferably 50 or more and 3000 or less, further preferably 150 or more and 2,900 or less, and particularly preferably 250 or more and 1,500 or less.

The content ratio of the polymerizable compound (C) in the coloring curable resin composition is less than 100% by mass based on the total amount of solid content. In a preferred aspect of the present invention, the content ratio of the polymerizable compound (C) in the coloring curable resin composition may be, for example, based on the total amount of the solid content, 1% by mass or more and 50% by mass or less, preferably 5% by mass or more and 45% by mass or less, more preferably 10% by mass or more and 40% by mass or less, and particularly preferably 15% by mass or more and 40% by mass or less.

[Polymerization Initiator (D)]

The polymerization initiator (D) is not particularly limited as long as it is a compound capable of initiating polymerization by generating an active radical, an acid, or the like by the action of light or heat, and a known polymerization initiator can be used.

Examples of the polymerization initiator (D) include an oxime compound such as an O-acyloxime compound, an alkylphenone compound, a biimidazole compound, a triazine compound; and an acylphosphine oxide compound.

Examples of the O-acyloxme compound include N-benzoyloxy-1-(4-phenylsulfanylphenyl)butan-1-one-2-imine, N-benzoyloxy-1-(4-phenylsulfanylphenyl)octan-1-one-2- imine, N-benzoyloxy-1-(4-phenylsulfanylphenyl)-3-cyclopentylpropan-1-one-2-imine, N-acetoxy-1-(4-phenylsufanylphenyl)-3-cyclopentylpropan-1-one-2-imine, N-acetoxy-1-(4-phenylsufanylphenyl)-3-cyclohexylpropan-1-one-2-imine, N-acetoxy-1-[9-ethyl-6-(2-methylbenzoyl)-9H-carbazol-3-yl]ethane-1-imine, N-acetoxy-1-[9-ethyl-6-{2-methyl-4-(3,3-dimethyl-2,4-dioxacyclopentanylmethyloxy)benzoyl}-9H-carbazol-3-yl]ethane-1-imine, N-acetoxy-1-[9-ethyl-6-(2-methylbenzoyl)-9H-carbazol-3-yl]-3-cyclopentylpropane-1-imine, and N-benzoyloxy-1-[9-ethyl-6-(2-methylbenzoyl)-9H-carbazol-3-yl]-3-cyclopentylpropan-1-one-2-imine. In addition, as the O-acyloxime compound, commercially available products such as Irgacure OXE01 and Irgacure OXE02 (all manufactured by BASF Japan Ltd.), and N-1919 (manufactured by ADEKA Corporation) may also be used. Of these, the O-acyloxime compound is preferably at least one selected from the group consisting of N-benzoyloxy-1-(4-phenylsulfanylphenyl)butan-1-one-2-imine, N-benzoyloxy-1-(4-phenylsulfanylphenyl)octan-1-one-2-imine, and N-benzoyloxy-1-(4-phenylsulfanylphenyl)-3-cyclopentylpropan-1-one-2-imine, and more preferably N-benzoyloxy-1-(4-phenylsulfanylphenyl)octan-1-one-2-imine.

Examples of the alkylphenone compound include 2-methyl-2-morpholino-1-(4-methylsulfanylphenyl)propan-1-one, 2-dimethylamino-1-(4-morpholinophenyl)-2-benzylbutan-1-one, and 2-dimethylamino-2-[(4-methylphenyl)methyl]-1-[4-(4-morpholinyl)phenyl]butan-1-one. As the alkylphenone compound, commercially available products such as Irgacure 369, Irgacure 907, and Irgacure 379 (all manufactured by BASF Japan Ltd.) may also be used.

Examples of the alkylphenone compound also include 2-hydroxy-2-methyl-1-phenylpropan-1-one, 2-hydroxy-2-methyl-1-[4-(2-hydroxyethoxy)phenyl]propan-1-one, 1-hydroxycyclohexyl phenyl ketone, a 2-hydroxy-2-methyl-1-(4-isopropenylphenyl)propan-1-one oligomer, α,α-diethoxyacetophenone, and benzil dimethyl ketal.

Examples of the biimidazole compound include 2,2'-bis(2-chlorophenyl)-4,4',5,5'-tetraphenylbiimidazole, 2,2'-bis(2,3-dichlorophenyl)-4,4',5,5'-tetraphenylbiimidazole (see, for example, Japanese Patent Laid-Open No. 6-75372 and Japanese Patent Laid-Open No. 6-75373), 2,2'-bis(2-chlorophenyl)-4,4',5,5'-tetra(alkoxyphenyl)biimidazole, 2,2'-bis(2-chlorophenyl)-4,4',5,5'-tetra(dialkoxyphenyl)biimidazole, 2,2'-bis(2-chlorophenyl)-4,4',5,5'-tetra(trialkoxyphenyl)biimidazole (see, for example, Japanese Patent Publication No. 48-38403 and Japanese Patent Laid-Open No. 62-174204), and a biimidazole compound in which a phenyl group at the 4,4',5,5' position is substituted with a carboalkoxy group (see, for example, Japanese Patent Laid-Open No. 7-10913).

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

Examples of the acylphosphine oxide compound include 2,4,6-trimethylbenzoyl diphenylphosphine oxide. Commercially available products such as Irgacure® 819 (manufactured by BASF Japan Ltd.) may also be used.

Further, examples of the polymerization initiator (D) include benzoin compounds such as benzoin, benzoin methyl ether, benzoin ethyl ether, benzoin isopropyl ether, and benzoin isobutyl ether; benzophenone compounds such as benzophenone, methyl o-benzoylbenzoate, 4-phenylbenzophenonne, 4-benzoyl-4'-methyldiphenyl sulfide, 3,3',4,4'-tetra(tert-butylperoxycarbonyl)benzophenone, and 2,4,6-trimethylbenzophenone; quinone compounds such as 9,10-phenanthrene quinone, 2-ethylanthraquinone, and camphorquinone; 10-butyl-2-chloroacridone, benzyl, methyl phenylglyoxylate, and a titanocene compound.

These are preferably used in combination with a polymerization initiation aid (hereinafter, also referred to as polymerization initiation aid (D1)) described later, an amine in particular.

The polymerization initiator (D) is preferably a polymerization initiator containing at least one selected from the group consisting of an alkylphenone compound, a triazine compound, an acylphosphine oxide compound, an oxime compound, and a biimidazole compound, more preferably a polymerization initiator containing an oxime compound, and still preferably a polymerization initiator containing an O-acyloxime compound.

In a preferred aspect of the present invention, the content ratio of the polymerization initiator (D) in the coloring curable resin composition may be, for example, based on the total amount of the solid content, 1% by mass or more and 20% by mass or less, preferably 2% by mass or more and 15% by mass or less, and more preferably 5% by mass or more and 12% by mass or less.

[Polymerization Initiation Aid (D1)]

The coloring curable resin composition may contain a polymerization initiation aid (D1). The polymerization initiation aid (D1) is a compound or a sensitizer used to promote the polymerization of the polymerizable compound (C) whose polymerization is initiated by the polymerization initiator (D). When the polymerization initiation aid (D1) is contained, it is usually used in combination with the polymerization initiator (D).

Examples of the polymerization initiation aid (D1) include amine compounds, alkoxyanthracene compounds, thioxanthone compounds, and carboxylic acid compounds.

Examples of the amine compound include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino)benzophenone (common name: Michler's ketone), 4,4'-bis(diethylamino)benzophenone, and 4,4'-bis(ethylmethylamino)benzophenone, and preferred examples thereof include 4,4'-bis(diethylamino)benzophenone. Further, as the amine compound, commercially available products such as EAB-F (manufactured by Hodogaya Chemical Co., Ltd.) may also be used.

Examples of the alkoxy anthracene compound include 9,10-dimethoxyanthracene, 2-ethyl-9,10-dimethoxyanthracene, 9,10-diethoxyanthracene, 2-ethyl-9,10-diethoxyanthracene, 9,10-dibutoxyanthracene, and 2-ethyl-9,10-dibutoxyanthracene.

Examples of the thioxanthone compound include 2-isopropylthioxanthone, 4-isopropylthioxanthone, 2,4-diethylthioxanthone, 2,4-dichlorothioxanthone, and 1-chloro-4-propoxythioxanthone.

Examples of the carboxylic acid compound include phenylsulfanylacetic acid, methylphenylsulfanylacetic acid, ethylphenylsulfanylacetic acid, methylethylphenylsulfanylacetic acid, dimethylphenylsulfanylacetic acid, methoxyphenysulfanylacetic acid, dimethoxyphenylsulfanylacetic acid, chlorophenylsulfanylacetic acid, dichlorophenylsulfanylacetic acid, N-phenylglycine, phenoxyacetic acid, naphthylthioacetic acid, N-naphthylglycine, and naphthoxyacetic acid.

When these polymerization initiation aids (D1) are used, the content ratio thereof is preferably 0.1% by mass or more and 30% by mass or less, and more preferably 1% by mass or more and 20% by mass or less, based on the total amount of the resin (B) and the polymerizable compound (C).

[Solvent (E)]

The coloring curable resin composition may contain a solvent (E). The solvent is not particularly limited, and a solvent usually used in the art can be used.

Examples of the solvent (E) include an ester solvent (a solvent which contains —CO—O— but does not contain —O— in its molecule), an ether solvent (a solvent which contains —O— but does not contain —CO—O— in its molecule), an ether ester solvent (a solvent which contains —CO—O— and —O— in its molecule), a ketone solvent (a solvent which contains —CO— but does not contain —CO—O— in its molecule), an alcohol solvent (a solvent which contains OH but does not contain —O—, —CO— nor —CO—O— in its molecule), an aromatic hydrocarbon solvent, an amide solvent, and dimethyl sulfoxide.

Examples of the ester solvent include methyl lactate, ethyl lactate, butyl lactate, methyl 2-hydroxy isobutanoate, ethyl acetate, n-butylacetate, isobutylacetate, pentyl formate, isopentyl acetate, butyl propionate, isopropyl butyrate, ethyl butyrate, butyl butyrate, methyl pyruvate, ethyl pyruvate, propyl pyruvate, methyl acetoacetate, ethyl acetoacetate, cyclohexanol acetate, and γ-butyrolactone.

Examples of the ether solvent include ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monopropyl ether, propylene glycol monobutyl ether, 3-methoxy-1-butanol, 3-methoxy-3-methylbutanol, tetrahydrofuran, tetrahydropyran, 1,4-dioxane, diethylene glycol dimethyl ether, diethylene glycol diethyl ether, diethylene glycol methyl ethyl ether, diethylene glycol dipropyl ether, diethylene glycol dibutyl ether, anisole, phenetole, and methyl anisole.

Examples of the ether ester solvent include methyl methoxyacetate, ethyl methoxyacetate, butyl methoxyacetate, methyl ethoxyacetate, ethyl ethoxyacetate, methyl 3-methoxypropionate, ethyl 3-methoxypropionate, methyl 3-ethoxypropionate, ethyl 3-ethoxypropionate, methyl 2-methoxypropionate, ethyl 2-methoxypropionate, propyl 2-methoxypropionate, methyl 2-ethoxypropionate, ethyl 2-ethoxypropionate, methyl 2-methoxy-2-methylpropionate, ethyl 2-ethoxy-2-methylpropionate, 3-methoxybutyl acetate, 3-methyl-3-methoxybutyl acetate, propylene glycol monomethyl ether acetate, propylene glycol monoethyl ether acetate, propylene glycol monopropyl ether acetate, ethylene glycol monomethyl ether acetate, ethylene glycol monoethyl ether acetate, diethylene glycol monomethyl ether acetate, diethylene glycol monobutyl ether acetate, and dipropylene glycol methyl ether acetate.

Examples of the ketone solvent include 4-hydroxy-4-methyl-2-pentanone, acetone, 2-butanone, 2-heptanone, 3-heptanone, 4-heptanone, 4-methyl-2-pentanone, cyclopentanone, cyclohexanone, and isophorone.

Examples of the alcohol solvent include methanol, ethanol, propanol, butanol, hexanol, cyclohexanol, ethylene glycol, propylene glycol, and glycerin.

Examples of the aromatic hydrocarbon solvent include benzene, toluene, xylene, and mesitylene.

Examples of the amide solvent include N,N-dimethylformamide, N,N-dimethylacetamide, and N-methylpyrrolidone.

These solvents may be used in combination of two or more kinds thereof.

Among the above solvents, an organic solvent having a boiling point at 1 atm of 120° C. or more and 180° C. or less is preferable from the viewpoints of coating properties and drying properties. Preferred examples of the solvent include propylene glycol monomethyl ether acetate, ethyl lactate, propylene glycol monomethyl ether, ethyl 3-ethoxypropionate, ethylene glycol monomethyl ether, diethylene glycol monomethyl ether, diethylene glycol monoethyl ether, 4-hydroxy-4-methyl-2-pentanone, and N,N-dimethylformamide, and more preferred examples thereof include propylene glycol monomethyl ether acetate, propylene glycol monomethyl ether, ethyl lactate, ethyl 3-ethoxypropionate, and 4-hydroxy-4-methyl-2-pentanone.

The content ratio of the solvent (E) is less than 100% by mass, preferably 70% by mass or more and 95% by mass or less, and still more preferably 75% by mass or more and 92% by mass or less, based on the total amount of the coloring curable resin composition. In other words, the total amount of the solid content of the coloring composition is preferably 5% by mass or more and 30% by mass or less, and more preferably 8% by mass or more and 25% by mass or less. In a preferred aspect of the present invention, the content ratio of the solvent (E) in the coloring curable resin composition may be, for example, based on the total amount of the coloring curable resin composition, 70% by mass or more and 95% by mass or less, and preferably 80% by mass or more and 90% by mass or less.

[Preparation of Colorant (A)-Containing Liquid]

When the coloring curable resin composition contains the solvent (E), a colorant (A)-containing liquid containing the colorant (A) and the solvent (E) may be prepared in advance, and then the coloring curable resin composition may be prepared using the colorant (A)-containing liquid. When the colorant (A) is not dissolved in the solvent (E), the colorant (A)-containing liquid can be prepared by dispersing and mixing the colorant (A) in the solvent (E). The colorant (A)-containing liquid may contain a part or all of the solvent (E) contained in the coloring curable resin composition.

The content ratio of the solid content in the colorant (A)-containing liquid is less than 100% by mass, preferably 0.01% by mass or more and 99.99% by mass or less, more preferably 0.1% by mass or more and 99.9% by mass or less, still more preferably 0.1% by mass or more and 99% by mass or less, further preferably 1% by mass or more and 90% by mass or less, even further preferably 1% by mass or more and 80% by mass or less, particularly preferably 1% by mass or more and 70% by mass or less, extremely preferably 1% by mass or more and 60% by mass or less, and most preferably 1% by mass or more and 50% by mass or less, based on the total amount of the colorant (A)-containing liquid.

The content ratio of the colorant (A) in the colorant (A)-containing liquid is 100% by mass or less, preferably 1% by mass or more and 99% by mass or less, more preferably 1% by mass or more and 95% by mass or less, still more preferably 1% by mass or more and 90% by mass or less, further preferably 3% by mass or more and 80% by mass or less, and even further preferably 5% by mass or more and 70% by mass or less, based on the total amount of the solid content in the colorant (A)-containing liquid. In a preferred aspect of the present invention, the content ratio of the colorant (A) in the colorant (A)-containing liquid may be, for example, based on the total amount of the solid content, 40% by mass or more and 80% by mass or less, and preferably 50% by mass or more and 70% by mass or less.

If necessary, the colorant (A) may be subjected to a rosin treatment, a surface treatment using a colorant (A) derivative or the like having an introduced acidic group or basic group, a colorant (A) surface graft treatment with a polymeric compound or the like, a particle micronization treatment with a sulfuric acid micronization method or the like, a washing treatment with an organic solvent, water or the like for removing impurities, a removing treatment with an ionic exchange method or the like of ionic impurities or the like. The colorant (A) preferably has a substantially uniform particle size.

The colorant (A) can be uniformly dispersed in the colorant (A)-containing liquid by dispersing the colorant (A) in the colorant (A)-containing liquid with a dispersant. The colorant (A) may be individually dispersed, or a plurality of kinds thereof may be mixed and dispersed.

Examples of the dispersant include a surfactant, which may be any of a cationic surfactant, an anionic surfactant, a nonionic surfactant, and an amphoteric surfactant. Specific examples thereof include a polyester-based surfactant, a polyamine-based surfactant, and an acrylic-based surfactant. These dispersants may be used singly or in combination of two or more kinds thereof. Examples of the dispersant include KP (manufactured by Shin-Etsu Chemical Co., Ltd.), FLOWLEN (manufactured by KYOEISHA CHEMICAL Co., LTD.), Solsperse® (manufactured by Zeneca Co., Ltd.), EFKA® (manufactured by BASF Japan Ltd.), AJISPER® (manufactured by Ajinomoto Fine-Techno Co., Inc.), DISPERBYK® (manufactured by BYK Japan KK.), and BYK® (manufactured by BYK Japan KK.).

When the colorant (A)-containing liquid contains a dispersant, the amount of the dispersant used (solid content) is, for example, based on 100 parts by mass of the colorant (A), 0.01 parts by mass or more and 10000 parts by mass or less, preferably 0.01 parts by mass or more and 5000 parts by mass or less, more preferably 0.01 parts by mass or more and 1000 parts by mass or less, still more preferably 0.1 parts by mass or more and 500 parts by mass or less, further preferably 0.1 parts by mass or more and 300 parts by mass or less, even further preferably 1 part by mass or more and 300 parts by mass or less, and particularly preferably 5 parts by mass or more and 260 parts by mass. When the amount of the dispersant is in the above range, a colorant (A)-containing liquid in a more uniform dispersion state tends to be obtained.

When the colorant (A)-containing liquid contains a pigment, the content ratio of the dispersant is preferably 1 part by mass or more and 100 parts by mass or less, more preferably 10 parts by mass or more and 70 parts by mass or less, and still more preferably 20 parts by mass or more and 60 parts by mass or less, based on 100 parts by mass of the total amount of the pigment.

When a colorant (A)-containing liquid containing the colorant (A) and the solvent (E) is prepared in advance and then the coloring curable resin composition is prepared by using the colorant (A)-containing liquid, the colorant (A)-containing liquid may contain a part or all, preferably a part of the resin (B) contained in the coloring curable resin composition in advance. By incorporating the resin (B) in advance, the dispersion stability of the colorant (A)-containing liquid can be further improved.

When the colorant (A)-containing liquid contains the resin (B), the content of the resin (B) is, for example, based on 100 parts by mass of the colorant (A), 0.01 parts by mass or more and 10000 parts by mass or less, preferably 0.01 parts by mass or more and 5000 parts by mass or less, more preferably 0.01 parts by mass or more and 1000 parts by mass or less, still more preferably 0.1 parts by mass or more and 500 parts by mass or less, and further preferably 0.1 parts by mass or more and 300 parts by mass or less.

In a preferred aspect of the present invention, when the colorant (A)-containing liquid contains the resin (B), the content ratio of the resin (B) in the colorant (A)-containing liquid may be, for example, based on 100 parts by mass of the colorant (A), 10 parts by mass or more and 50 parts by mass or less, and preferably 20 parts by mass or more and 40 parts by mass or less.

The coloring curable resin composition may further contain a leveling agent (F) and an antioxidant (G).

[Leveling Agent (F)]

The coloring curable resin composition may contain a leveling agent (F).

Examples of the leveling agent (F) include a silicone-based surfactant, a fluorine-based surfactant, and a silicone-based surfactant having a fluorine atom. These may have a polymerizable group at its side chain.

Examples of the silicone-based surfactant include a surfactant having a siloxane bond in its molecule. Specific examples thereof include Toray Silicone DC3PA, Toray Silicone SH7PA, Toray Silicone DC11PA, Toray Silicone SH21PA, Toray Silicone SH28PA, Toray Silicone SH29PA, Toray Silicone SH30PA, and Toray Silicone SH8400 (trade names: manufactured by Dow Corning Toray Co., Ltd.); KP321, KP322, KP323, KP324, KP326, KP340, and KP341 (manufactured by Shin-Etsu Chemical Co., Ltd.); and TSF400, TSF401, TSF410, TSF4300, TSF4440, TSF4445, TSF4446, TSF4452, and TSF4460 (manufactured by Momentive Performance Materials Japan LLC).

Examples of the fluorine-based surfactant include a surfactant having a fluorocarbon chain in its molecule. Specific examples thereof include Fluorad® FC430 and Fluorad FC431 (manufactured by Sumitomo 3M Limited); MEGAFACE® F142D, MEGAFACE F171, MEGAFACE F172, MEGAFACE F173, MEGAFACE F177, MEGAFACE F183, MEGAFACE F554, MEGAFACE R30, and MEGAFACE RS-718-K (manufactured by DIC Corporation); EFTOP® EF301, EFTOP EF303, EFTOP EF351, and EFTOP EF352 (manufactured by Mitsubishi Materials Electronic Chemicals Co., Ltd.); Surflon® S381, Surflon S382, Surflon SC101, and Surflon SC105 (manufactured by Asahi Glass Co., Ltd.); and E5844 (manufactured by Daikin Fine Chemical Laboratory).

Examples of the silicone-based surfactant having a fluorine atom include a surfactant having a siloxane bond and a fluorocarbon chain in its molecule. Specific examples thereof include MEGAFACE® R08, MEGAFACE BL20, MEGAFACE F475, MEGAFACE F477, and MEGAFACE F443 (manufactured by DIC Corporation).

When the leveling agent (F) is contained, the content ratio thereof is usually 0.0001% by mass or more and 5% by mass or less, preferably 0.0001% by mass or more and 3% by mass or less, more preferably 0.0001% by mass or more and 2% by mass or less, and still more preferably 0.0001% by mass or more and 1% by mass or less, based on the total amount of the coloring curable resin composition. In a preferred aspect of the present invention, the content ratio of the leveling agent (F) may be, for example, based on the total amount of the coloring curable resin composition, 0.001% by mass or more and 1% by mass or less, and preferably 0.005% by mass or more and 0.05% by mass or less.

When the content of the leveling agent (F) is within the above range, it is possible to make the flatness of the color filter good.

[Antioxidant (G)]

The coloring curable resin composition may contain an antioxidant (G).

From the viewpoint of improving heat resistance and light resistance of the colorant, it is preferable to use the antioxidant singly or in combination of two or more kinds thereof. The antioxidant is not particularly limited as long as it is an antioxidant that is generally used industrially, and a phenol-based antioxidant, a phosphorus-based antioxidant, a sulfur-based antioxidant, and the like can be used.

Examples of the phenol-based antioxidant include Irganox 1010 (Irganox 1010: pentaerythritol tetrakis[3-(3,5-di-tert-butyl-4-hydroxyphenyl)propionate], manufactured by BASF Japan Ltd.), Irganox 1076 (Irganox 1076: octadecyl-3-(3,5-di-tert-butyl-4-hydroxyphenyl)propionate, manufactured by BASF Japan Ltd.), Irganox 1330 (Irganox 1330: 3,3',3",5,5',5"-hexa-tert-butyl-a,a',a"-(mesitylene-2,4,6-triyl)tri-p-cresol, BASF Japan Ltd.), Irganox 3114 (Irganox 3114: 1,3,5-tris(3,5-di-tert-butyl-4-hydroxybenzyl)-1,3,5-triazine-2,4,6(1H,3H,5H)-trione, manufactured by BASF Japan Ltd.), Irganox 3790 (Irganox 3790: 1,3,5-tris ((4-tert-butyl-3-hydroxy-2,6-xylyl)methyl)-1,3,5-triazine-2,4,6(1H,3H,5H)-trione, manufactured by BASF Japan Ltd.), Irganox 1035 (Irganox 1035: thiodiethylenebis[3-(3,5-di-tert-butyl-4-hydroxyphenyl)propionate], manufactured by BASF Japan Ltd.), Irganox 1135 (Irganox 1135: 3,5-bis(1,1-dimethylethyl)-4-hydroxy-C7-C9 side-chain alkyl ester of benzene propanoic acid, manufactured by BASF Japan Ltd.), Irganox 1520 L (Irganox 1520 L: 4,6-bis(octylthiomethyl)-o-cresol, manufactured by BASF Japan Ltd.), Irganox 3125 (Irganox 3125, manufactured by BASF Japan Ltd.), Irganox 565 (Irganox 565: 2,4-bis(n-octylthio)-6-(4-hydroxy-3',5'-di-tert-butylanilino)-1,3,5-triazine, manufactured by BASF Japan Ltd.), ADK STAB AO-80 (ADK STAB AO-80: 3,9-bis(2-(3-(3-tert-butyl-4-hydroxy-5-methylphenyl)propionyloxy)-1,1-dimethylethyl)-2,4,8,10-tetraoxaspiro(5,5)undecane, manufactured by ADEKA Corporation), SUMILIZER BHT (SUMILIZER BHT, manufactured by Sumitomo Chemical Co., Ltd.), SUMILIZER GA-80 (SUMILIZER GA-80, manufactured by Sumitomo Chemical Co., Ltd.), SUMILIZER GS (SUMILIZER GS, manufactured by Sumitomo Chemical Co., Ltd.), Cyanox 1790 (Cyanox 1790, manufactured by Cytec Industries Inc.), and vitamin E (manufactured by Eisai Co., Ltd.).

Examples of the phosphorus-based antioxidant include Irgafos 168 (Irgafos 168: tris(2,4-di-tert-butylphenyl)phosphite, manufactured by BASF Japan Ltd.), Irgafos12 (Irgafos 12: tris[2-[[2,4,8,10-tetra-tert-butyldibenzo[d,f][1,3,2]dioxaphosphine-6-yl]oxy]ethyl]amine, manufactured by BASF Japan Ltd.), Irgafos 38 (Irgafos 38: bis(2,4-bis(1,1-dimethylethyl)-6-methylphenyl)ethyl ester phosphite, manufactured by BASF Japan Ltd.), ADK STAB 329K (manufactured by ADEKA Corporation), ADK STAB PEP36 (manufactured by ADEKA Corporation), ADK STAB PEP-8 (manufactured by ADEKA Corporation), Sandstab P-EPQ (manufactured by Clariant AG), Weston 618 (Weston 618, manufactured by GE), Weston 619G (Weston 619G, manufactured by GE), Ultranox 626 (Ultranox 626, manufactured by GE), and SUMILIZER GP (SUMILIZER GP: 6-[3-(3-tert-butyl-4-hydroxy-5-methylphenyl)propoxy]-2,4,8,10-tetra-tert-butyldibenz[d,f][1.3.2]dioxaphosphepine) (manufactured by Sumitomo Chemical Co., Ltd.).

Examples of the sulfur-based antioxidant include dialkyl thiodipropionate compounds such as dilauryl thiodipropionate, dimyristyl thiodipropionate, and distearyl thiodipropionate; and β-alkylmercaptopropionic acid ester compounds of polyols such as tetrakis[methylene (3-dodecylthio)propionate]methane.

[Other Components]

If necessary, the coloring curable resin composition may contain an additive known in the art, such as a filler, other polymeric compounds, an adhesion promotor, a light stabilizer, or a chain transfer agent.

Examples of the adhesion promotor include vinyltrimethoxysilane, vinyltriethoxysilane, vinyltris(2-methoxyethoxy)silane, 3-glycidyloxypropyltrimethoxysilane, 3-glycidoxypropylmethyldimethoxysilane, 3-glycidoxypropylmethyldiethoxysilane, 2-(3,4-epoxycyclohexyl)ethyltrimethoxysilane, 3-chloropropylmethydimethoxysilane, 3-chloropropyltrimethoxysilane, 3-methacryloyloxypropyltrimethoxysilane, 3-mercaptopropyltrimethoxysilane, 3-sulfanylpropyltrimethoxyslane, 3-iscocyanatopropyltriethoxysilane, N-2-(aminoethyl)-3-aminopropylmethyldimethoxysilane, N-2-(aminoethyl)-3-aminopropylmethyldiethoxysilane, N-2-(aminoethyl)-3-aminopropyltrimethoxysilane, N-2-(aminoethyl)-3-aminopropylmethyldiethoxysilane, 3-aminopropyltrimethoxysilane, 3-aminopropyltriethoxysilane, N-phenyl-3-aminopropyltrimethoxysilane, and N-phenyl-3-aminopropyltriethoxysilane.

[Method for Producing Coloring Curable Resin Composition]

The coloring curable resin composition can be prepared, for example, by mixing the colorant (A), the resin (B), the polymerizable compound (C), the polymerization initiator (D), and as necessary, the polymerization initiation aid (D1), the solvent (E), the leveling agent (F), the antioxidant (G), and other components.

Mixing can be carried out by using a known or conventional device or under known or conventional conditions.

The colorant (A) is preferably used in a state of a colorant (A) dispersion obtained by mixing the colorant (A) with a part or all of the solvent (E) in advance and dispersing the mixture using a bead mill or the like until the average particle size of the colorant (A) becomes about 0.2 μm or less. At this time, a part or all of the dispersant and the resin (B) may be blended as necessary.

The colorant (A) is preferably dissolved in a part or all of the solvent (E) in advance to prepare a solution. The solution is preferably filtered through a filter having a pore size of about 0.01 μm or more and 1 μm or less.

The coloring curable resin composition after mixing is preferably filtered through a filter having a pore size of about 0.01 μm or more and 10 μm or less.

<Reflection Film>

The display device is not particularly limited, and may include a light reflecting member for irradiating the light of the light source toward the mixture or the laminated structure.

The reflection film is not particularly limited, and may include any suitable known material such as a reflecting mirror, a film of reflective particles, a reflective metal film, a reflector, or the like.

<Diffusion Film>

The display device is not particularly limited, and may include a diffusion film for diffusing the light of the light source or the light emitted from the mixture. The diffusing film may include any diffusion film known in the art, such as an amplified diffusing film.

<Brightness Enhancement Unit>

The display device according to the present invention is not particularly limited, but may include a brightness enhancement unit that reflects and returns a part of the light in the direction in which the light is transmitted.

<Prism Sheet>

The prism sheet typically has a base material section and a prism section. The base material section may be omitted, depending on the adjacent members. The prism sheet may be pasted together with the adjacent members via any appropriate adhesive layer (for example, an adhesive layer or a pressure sensitive adhesive layer). The prism sheet is configured to have a plurality of unit prisms that are convex in parallel on the side opposite to the visible side (rear side). By arranging the convex sections of the prism sheet toward the rear side, the light that passes through the prism sheet is more likely to be focused. Also, when the convex sections of the prism sheet are arranged toward the rear side, there is less light reflected without incident on the prism sheet compared to the case where the convex sections are arranged toward the visible side, and a display with high brightness can be obtained.

<Light Guide Plate>

Any appropriate light guide plate may be used as the light guide plate. For example, a light guide plate having a lens pattern formed on the rear side such that light from the lateral direction can be deflected in the thickness direction or a light guide plate having a prism shape or the like formed on the rear side and/or the visible side can be used.

<Medium Material Layer Between Elements>

The display device according to the present invention is not particularly limited, but may include a layer composed of one or more medium materials on the optical path between adjacent elements (layers). Examples of the one or more medium materials include, but not limited to, vacuum, air, gas, optical materials, adhesives, optical adhesives, glass, polymers, solids, liquids, gels, cured materials, optical bonding materials, refractive index matching or refractive index mismatching materials, refractive index gradient materials, cladding or anti-cladding materials, spacers, silica gel, brightness enhancement materials, scattering or diffusion materials, reflective or anti-reflective materials, wavelength selective materials, wavelength selective anti-reflective materials, or other suitable media known in the art.

Specific examples of the display device include those provided with a wavelength conversion material for an EL display or a liquid crystal display. Specific examples thereof include a display device in which the color conversion layer (B) is disposed between the light source (A) and the light guide plate along an end surface (side surface) of the light guide plate to form a backlight (on-edge type backlight) that emits white light, and the color filter (C) is disposed on the light guide plate side; a display device in which the color conversion layer (B) is disposed on the light guide plate to form a backlight (surface-mounting type backlight) that emits light irradiated from the light source (A) placed on an end surface (side surface) of the light guide plate to the color conversion layer (B) through the light guide plate as white light, and the color filter (C) is disposed on the color conversion layer (B); and a display device in which the quantum dot composition is disposed in the vicinity of a light-emitting portion of the light source (A) as the color conversion layer (B) to form a backlight (on-chip type backlight) that emits irradiated light as white light, and the color filter (C) is disposed on the color conversion layer (B).

The display device is preferably a display device in which the light source (A), the color conversion layer (B), and the color filter (C) are disposed and/or laminated in this order in the optical path of the light from the light source (A).

FIG. 3 is a schematic cross-sectional view of a display device according to an embodiment of the present invention. The display device 100 shown in FIG. 3 includes a light source (A) 110, a color conversion layer (B) 120, and a color filter (C) 130. As shown in the figure, the display device 100 may further include a light guide plate 140.

With respect to the display device, the coverage of the color gamut of Rec. ITU-R BT.2020 (hereinafter, also referred to as coverage for the sake of simplification) is preferably, for example, 54% or more, and the extraction efficiency may be 30% or more, and the coverage is preferably 65% or more, and the extraction efficiency may be 32% or more. In Rec. ITU-R BT.2020, the chromaticity coordinates (x, y) of red color are (0.708, 0.292), the chromaticity coordinates (x, y) of green color are (0.170, 0.797), and the chromaticity coordinates (x, y) of blue color are (0.131, 0.046).

<Display>

As shown in FIG. 4, a display 200 of the present embodiment includes a liquid crystal panel 201 and the above-described display device 100 in this order from the viewing side. The liquid crystal panel 201 typically includes a liquid crystal cell; a viewing-side polarizing plate disposed on a viewing side of the liquid crystal cell; and a rear-side polarizing plate disposed on a rear side of the liquid crystal cell. The display may further include other appropriate optional members.

<Liquid Crystal Panel>

The liquid crystal panel typically includes a liquid crystal cell; a viewing-side polarizing plate disposed on a viewing side of the liquid crystal cell; and a rear-side polarizing plate disposed on a rear side of the liquid crystal cell. The viewing-side polarizing plate and the rear-side polarizing plate can be disposed such that respective absorption axes are substantially orthogonal or parallel to each other.

[Liquid Crystal Cell]

The liquid crystal cell has a pair of substrates and a liquid crystal layer as a display medium sandwiched between the substrates. In a general configuration, a color filter and a black matrix are provided on one substrate, and switching elements for controlling electro-optical characteristics of liquid crystals, scanning lines for applying gate signals to the switching elements, signal lines for applying source signals to the switching elements, pixel electrodes, and counter electrodes are provided on the other substrate. The spacing (cell gap) between the substrates can be controlled by a spacer or the like. For example, an alignment film made of polyimide can be provided on the side of the substrate in contact with the liquid crystal layer.

[Polarizing Plate]

The polarizing plate typically has a polarizer and protective layers disposed on both sides of the polarizer. The polarizer is typically an absorption type polarizer.

Any appropriate polarizer may be used as the polarizer. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these, a polarizer obtained by adsorbing a dichroic material such as iodine to a polyvinyl alcohol-based film and uniaxially stretching the film is particularly preferable because of its high polarization dichroic ratio.

EXAMPLES

Hereinafter, the present invention will be described in more detail by way of examples, but the present invention is not limited to the following examples. Unless otherwise specified, "%" and "part" in the example are % by mass and parts by mass.

<Measurement of Spectrum Curve I(x)>

A spectrum was measured in front (0°) of the display device in which a light conversion layer and a color filter were disposed in this order on a light source using an electron cooling rear surface incident type high S/N fiber multichannel spectroscope QE65Pro (manufactured by Ocean Optics, Inc.) equipped with an optical fiber. On that occasion, the distance between the display device and the detecting unit was set to 30 mm. The maximum peak wavelength [nm] $Peak_{b,g,r}$ and the full width at half maximum [nm] $FWHM_{b,g,r}$ in each of the three wavelength ranges of 380 nm or more and less than 495 nm, 495 nm or more and 585 nm or less, and more than 585 nm and 780 nm or less in the spectrum curve I(x) are shown in Table 1.

<Measurement of Spectrum Curve $T_{b,g,r}(x)$>

An ultraviolet-visible near-infrared spectrophotometer (UV-3600; manufactured by Shimadzu Corporation) equipped with an integrating sphere was used. The measurement substrate was a glass substrate on which a color filter was directly formed on a glass substrate. The background was acquired with a glass substrate. The maximum peak wavelengths [nm] of the spectrum curve $T_{b,g,r}(x)$ are shown in Table 1.

<Measurement of Chromaticity>

The chromaticity (x, y) and intensity were each obtained from the spectrum curve $T_{b,g,r}(x)$ measured above. The chromaticity (x, y) is the xy chromaticity coordinates (x, y) in the XYZ color system of CIE.

<Measurement of Peak Wavelength of Light Source>

The emission spectrum of the light source was measured by the spectroscope used for the measurement of the spectrum curve I(x) described above, and the peak wavelength of the light source was read from the measured emission spectrum.

<Measurement of Thickness of Color Conversion Layer>

The film thickness was measured using a film thickness measurement device (DEKTAK3; manufactured by Nihon Shinku Gijutsu Kabushiki Gaisha).

<Measurement of Emission Spectrum of Quantum Dots>

Using an absolute PL quantum yield measuring device (trade name: C9920-02, manufactured by HAMAMATSU PHOTONICS K.K., excitation light 450 nm, room temperature, in the atmosphere), the emission spectrum was measured. The maximum peak wavelength (λmax) [nm] and the full width at half maximum [nm] were obtained from the obtained emission spectrum.

<Measurement of Emission Spectrum of Perovskite Fluorescent Particles>

Using an absolute PL quantum yield measuring device (trade name: C9920-02, manufactured by HAMAMATSU PHOTONICS K.K., excitation light 450 nm, room temperature, in the atmosphere), the emission spectrum was measured. The maximum peak wavelength (λmax) [nm] and the full width at half maximum [nm] were obtained from the obtained emission spectrum.

<Measurement of Weight-Average Molecular Weight (Mw) and Number-Average Molecular Weight (Mn)>

The weight-average molecular weight (Mw) and number-average molecular weight (Mn) in terms of polystyrene of the resin (B) were measured by the GPC method under the following conditions.

Equipment: HLC-8120GPC (manufactured by Tosoh Corporation)
Column: TSK-GELG2000HXL
Column temperature: 40° C.
Solvent: Tetrahydrofuran
Flow rate: 1.0 mL/min
Solid content concentration of analytical sample: 0.001 to 0.01% by mass
Injection volume: 50 µL
Detector: RI
Standard for calibration: TSK STANDARD POLYSTYRENE F-40, F-4, F-288, A-2500, A-500 (manufactured by Tosoh Corporation)

The ratio (Mw/Mn) of the weight-average molecular weight (Mw) and number-average molecular weight (Mn) in terms of polystyrene obtained above was defined as the degree of dispersion.

<Determination of α>

Using the spectrum curve I(x) obtained above, α in the condition (I) was determined according to the following formula. Here, the following formula h(x) represents a proportion of the intensity of the spectrum curve I(x) at a corresponding wavelength to the region of the spectrum curve I(x) in the wavelength ranges of 380 nm≤x<495 nm, 495 nm≤x≤585 nm, and 585 nm≤x≤780 nm when the intensity in the spectrum curve I(x) in the wavelength ranges of 440<x<460, 520<x<540, and 620<x<650 is assumed to be 0.

$$\alpha = \int_{380}^{780} h(x)dx \qquad \text{[Expression 2]}$$

$$h(x) = \begin{cases} 0 \ (440 < x < 460,\ 520 < x < 540,\ 620 < x < 650) \\ \dfrac{I(x)}{\int_{380}^{495} I(x)dx} \ (380 \le x \le 440,\ 460 \le x < 495) \\ \dfrac{I(x)}{\int_{495}^{585} I(x)dx} \ (495 \le x \le 520,\ 540 \le x \le 585) \\ \dfrac{I(x)}{\int_{585}^{780} I(x)dx} \ (585 < x \le 620,\ 650 \le x \le 780) \end{cases}$$

<Determination of β>

Using the measured spectrum curve $T_{b,g,r}(x)$ of each color filter, β in the condition (II) was determined according to the following formula. Here, the following formula j(x) represents a function that gives a light transmittance of 0 in the wavelength ranges of 380 nm≤x<440 nm, 460 nm<x<520 nm, 540 nm<x<620 nm, and 650 nm<x≤780 nm, and gives a light transmittance equal to the light transmittance of the spectrum curve $T_{b,g,r}(x)$ at a corresponding wavelength in each of the wavelength regions of 440 nm≤x≤460 nm, 520 nm≤x≤540 nm, and 620 nm≤x≤650 nm.

$$\beta = \int_{380}^{780} j(x)dx \quad \text{[Expression 3]}$$

$$j(x) = \begin{cases} 0 & (380 \le x < 440, 460 < x < 520, \\ & 540 < x < 620, 650 < x \le 780) \\ T_b(x) & (440 \le x \le 460) \\ T_g(x) & (520 \le x \le 540) \\ T_r(x) & (620 \le x \le 650) \end{cases}$$

<Coverage>

When the area of the overlapping portion of the color gamut surrounded by the coordinates calculated from the xy chromaticity coordinates (x, y) measured in accordance with the "Measurement of chromaticity" described above and the color gamut surrounded by the coordinates of BT 2020 is defined as Y1, and the color gamut surrounded by the coordinates of BT 2020 is defined as Y2, the following formula:

$$Y=(Y1/Y2)\times 100$$

<Extraction Efficiency>

Integrated intensities Zb, Zg, Zr of spectra emitted from a blue color filter, a green color filter, and a red color filter disposed in the display device were measured respectively, and the extraction efficiency Z was calculated according to the following formula:

$$Z=[(Zr+Zg+Zb)/3Zb]\times 100$$

<Performance Evaluation Value>

Calculation was performed according to the following formula:

Performance evaluation value=$(Y\times Z)/100$

Y: Coverage
Z: Extraction efficiency

<Synthesis Example 1> Resin (F2)

Into a flask equipped with a reflux condenser, a dropping funnel, and a stirrer, an appropriate amount of nitrogen was poured to purge the inside of the flask with a nitrogen atmosphere, and 371 parts of propylene glycol monomethyl ether acetate were added thereto, and the mixture was heated to 85° C. while stirring. Next, a mixed solution prepared by dissolving 54 parts of acrylic acid, 225 parts of a mixture of 3,4-epoxytricyclo[5.2.1.0$^{2,6}$]decan-8-yl acrylate and 3,4-epoxytricyclo[5.2.1.0$^{2,6}$]decan-9-yl acrylate (content ratio is 50:50 in molar ratio), and 81 parts of vinyl toluene (isomer mixture) in 80 parts of propylene glycol monomethyl ether acetate was dropped into the flask over 4 hours. Meanwhile, a solution prepared by dissolving 30 parts of the polymerization initiator 2,2-azobis(2,4-dimethylvaleronitrile) in 160 parts of propylene glycol monomethyl ether acetate was dropped over 5 hours. After the completion of the dropping of the initiator solution, the mixture was kept at 85° C. for 4 hours and then cooled to room temperature to obtain a copolymer (resin F2) solution. The solid content of the resin F2 solution was 37%, and the weight-average molecular weight was 10600.

<Preparation of Light Source>

Light source 1: blue light emitting diode having a maximum peak wavelength of 443 nm Light source 2: blue light emitting diode having a maximum peak wavelength of 460 nm <Preparation of Red Fluorescent Particles>

Red fluorescent particles 1: quantum dots 1 (CdSe/ZnSeS), maximum peak wavelength: 640 nm, full width at half maximum: 24 nm Red fluorescent particles 2: quantum dots 2 (CdSe/ZnSeS), maximum peak wavelength: 635 nm, full width at half maximum: 24 nm Red fluorescent particles 3: quantum dots 3 (CdSe/ZnSeS), maximum peak wavelength: 646 nm, full width at half maximum: 28 nm Red fluorescent particles 4: quantum dots 4 (CdSe/ZnSeS), maximum peak wavelength: 608 nm, full width at half maximum: 44 nm <Preparation of Red Fluorescent Particle Dispersion>

Toluene dispersions containing 10% of red fluorescent particles 1 to 4 respectively were mixed with a dispersant BYK-LP N6919 so that the solid content ratio was 1.1, to obtain quantum dot dispersions Q1 to 4. The concentration of each toluene dispersion was calculated from the remaining amount of the mixture heated to 550° C. at a temperature increasing rate of 5° C./min by TG-DTA measurement after removal of toluene.

<Preparation of Green Fluorescent Particles>

Green fluorescent particles 1: Polysilazane-coated perovskite 1 (CsPbBr3), maximum peak wavelength: 535 nm, full width at half maximum 20 nm Green fluorescent particles 2: Polysilazane-coated perovskite 2 (FAPbBr3), maximum peak wavelength: 540 nm, full width at half maximum: 19 nm Green fluorescent particles 3: Polysilazane-coated perovskite 3 (FAPbBr3), maximum peak wavelength: 530 nm, full width at half maximum: 23 nm Green fluorescent particles 5: quantum dots 5 (CdSe/ZnSeS), maximum peak wavelength: 542 nm, full width at half maximum: 35 nm Green fluorescent particles 6: quantum dots 6 (CdSe/ZnS), maximum peak wavelength: 527 nm, full width at half maximum: 34 nm <Preparation of Green Fluorescent Particle Dispersion>

Toluene dispersions P1 to 3 containing 10% of green fluorescent particles 1 to 3 respectively were prepared. The concentration of each toluene dispersion was calculated from the remaining amount of the mixture heated to 550° C. at a temperature increasing rate of 5° C./min by TG-DTA measurement after removal of toluene.

A toluene dispersion containing 10% of green fluorescent particles 5 was mixed with a dispersant BYK-LP N6919 so that the solid content ratio was 1:1, to obtain a green fluorescent particle dispersion Q5.

<Preparation of Scattering Agent Dispersion>

A scattering agent dispersion obtained by mixing 60 parts of titanium oxide particles, 5 parts of a dispersant BYK-LP N6919 in terms of solid content, and PGMEA so that the whole amount was 100 parts and then sufficiently dispersing the titanium oxide particles using a bead mill was used.

<Preparation of Color Conversion Composition>

The materials were mixed so as to make a solid content ratio as shown in Table 1 to prepare quantum dot compositions 1 to 6.

TABLE 1

| | | Quantum dot composition | | | | | |
|---|---|---|---|---|---|---|---|
| | | 1 | 2 | 3 | 4 | 5 | 6 |
| Red fluorescent particles | Quantum dots 1 | 1 | — | — | — | — | 0.2 |
| | Quantum dots 2 | — | 1 | — | — | — | — |
| | Quantum dots 3 | — | — | 1 | 2 | — | — |
| | Quantum dots 4 | — | — | — | — | 0.1 | — |
| Green fluorescent particles | Perovskite 1 | 2 | — | — | — | — | — |
| | Perovskite 2 | — | 2 | — | — | — | — |
| | Perovskite 3 | — | — | 2 | 4 | — | — |
| | Quantum dots 5 | — | — | — | — | 0.9 | — |
| | Quantum dots 6 | — | — | — | — | — | 1.8 |
| Scattering agent | | 0.25 | 0.25 | 0.25 | 0.5 | 0.25 | 0.25 |
| Dispersant | BYK-6919 | 1 | 1 | 1 | 2 | 1 | 1 |
| Polymerizable compound | IBXA | 44.95 | 44.95 | 44.95 | 40.95 | 46.7 | 45.95 |
| | TMPTA | 50 | 50 | 50 | 50 | 50 | 50 |
| Polymerization initiator | Omnirad 819 | 0.4 | 0.4 | 0.4 | 0.4 | 0.4 | 0.4 |
| Antioxidant | SUMILIZER GP | 0.4 | 0.4 | 0.4 | 0.4 | 0.4 | 0.4 |

IBXA: isobornyl acrylate
TMPTA: trimethylolpropane triacrylate

<Preparation of Color Conversion Layer>

Color conversion layers were prepared according to the configurations shown in Table 2. Each color conversion layer was applied with a bar coat on a lower substrate so as to have a predetermined thickness and dried at 80° C. for 3 minutes, and then an upper substrate was bonded thereto to cure the color conversion layer by exposing the color conversion layer to light with 200 mJ of UV through the substrate. In the case where the upper substrate was not used, the color conversion layer was cured by exposing the color conversion layer to light under a nitrogen atmosphere.

TABLE 2

| | | Color conversion layer | | | | | |
|---|---|---|---|---|---|---|---|
| | | 1 | 2 | 3 | 4 | 5 | 6 |
| Upper substrate | Type | PET | PET | PET | — | PET | PET |
| | Thickness [μm] | 100 | 100 | 100 | — | 100 | 38 |
| Color conversion layer | Type of quantum dot composition | 1 | 2 | 3 | 4 | 5 | 6 |
| | Thickness [μm] | 80 | 80 | 80 | 40 | 120 | 60 |
| Lower substrate | Type | PET | PET | PET | PET | PET | PET |
| | Thickness [μm] | 100 | 100 | 100 | 100 | 100 | 38 |
| Total thickness | | 280 | 280 | 280 | 140 | 320 | 136 |

<Preparation of Coloring Matter Dispersions pH-1 to pH-4>

The coloring matter was mixed according to the compositions and ratios shown in Table 3 below to obtain coloring matter dispersions Ph-1 to Ph-4.

TABLE 3

| | | Coloring matter dispersion | | | |
|---|---|---|---|---|---|
| | | Ph-1 | Ph-2 | Ph-3 | Ph-4 |
| Blue coloring matter | P1 | 12 | — | — | — |
| Green coloring matter | P2 | — | 14 | — | — |
| Yellow coloring matter | P3 | — | — | 12 | — |
| Red coloring matter | P4 | — | — | — | 12 |
| Coloring matter dispersant | | 4.8 | 4.1 | 6 | 6 |
| Resin | F3 | 3.6 | 3 | 4.8 | — |
| Solvent | K1 | 66.7 | 78.9 | 77 | 77 |
| | K2 | 12.9 | — | 5 | 5 |

Unit: parts by mass

Blue coloring matter (P1): C.I. Pigment Blue 15:6
Green coloring matter (P2): C.I. Pigment Green 36
Yellow coloring matter (P3): C.I. Pigment Yellow 150
Red coloring matter (P4): C.I. Pigment Red 254
Coloring matter dispersant: solvent-based pigment dispersant
Resin (F3): methacrylic acid/benzyl methacrylate copolymer (copolymerization ratio (mass ratio): 30/70, Mw: $1.2 \times 10^4$)
Solvent (K1): propylene glycol monomethyl ether acetate (PGMEA)
Solvent (K2): propylene glycol 1-monomethyl ether (PGME)

<Preparation of Coloring Curable Resin Composition>

The components shown in Table 4 were mixed to obtain coloring curable resin compositions (D-b1), (D-b2), (D-g1), and (D-r1) for forming light absorption layers. In Table 4, the parts of the resin are shown in terms of solid content.

TABLE 4

| | | Coloring curable resin composition | | | |
|---|---|---|---|---|---|
| | | D-b1 | D-b2 | D-g1 | D-r1 |
| Coloring matter dispersion | Ph-1 | 269 | 433 | — | — |
| | Ph-2 | — | — | 114 | — |
| | Ph-3 | — | — | 200 | — |
| | Ph-4 | — | — | — | 292 |
| Resin | F2 | 9 | 9 | 9 | 14 |
| Polymerizable compound | G2 | 50 | 50 | 16 | 25 |
| Polymerization initiator | H2 | 15 | 15 | 5 | 8 |
| Leveling agent | J2 | 0.1 | 0.1 | 0.1 | 0.1 |
| Solvent | K1 | 558 | 558 | 322 | 307 |
| | K2 | 35 | 35 | — | 18 |

Unit: parts by mass

Polymerizable compound (G2): dipentaerythritol hexaacrylate (trade name: KAYARAD® DPHA; manufactured by Nippon Kayaku Co., Ltd.)
Polymerization Initiator (H2): N-benzoyloxy-1-(4-phenylsulfanylphenyl)octan-1-on-2-imine, trade name: Irgacure® OXE-01: manufactured by BASF Japan Ltd.
Leveling agent (J2): Polyether-modified silicone oil, trade name: Toray Silicone SH8400, manufactured by Dow Corning Toray Co., Ltd.

Example 1

Onto a 5-cm square glass substrate (Eagle 2000; manufactured by Corning Incorporated), the coloring curable resin composition (D-r1) for a color filter was applied by a spin coat method, and then prebaked at 100° C. for 3 minutes, to form a red curable resin composition layer. The substrate on which the red curable resin composition layer was formed was subjected to light irradiation in an exposure amount (basis: 365 nm) of 100 mJ/cm² under an air atmosphere using an exposure device (TME-150RSK; manufactured by TOPCON CORPORATION) and after development, post-baking was performed at 230° C. for 20 minutes, to obtain a cured film. This cured film was used as a red color filter (C-r1). In the same manner, a green color filter (C-r1) was prepared on the substrate on which the red color filter (C-r1) was prepared, using the green curable resin composition (D-g1), and next, a blue color filter (C-b1) was prepared using the blue curable resin composition (D-b1). In this manner, the color filter (C) was prepared.

According to the conditions for production of the display device shown in Table 5, the display device was produced by mounting on the light source (A) so that the color filter (C) was disposed on the color conversion layer (B). The evaluation results are shown in Table 5.

Examples 2 to 6 and Comparative Examples 1 and 2

A display device was produced in the same manner as in Example 1 except that the materials and film thicknesses were as shown in Table 5. The evaluation results are shown in Table 5.

TABLE 5

| | | Example | | | | | | Comparative Example | |
|---|---|---|---|---|---|---|---|---|---|
| | | 1 | 2 | 3 | 4 | 5 | 6 | 1 | 2 |
| Light source (A) | B-1 | | | | | | | ○ | ○ |
| | B-2 | ○ | ○ | ○ | ○ | ○ | ○ | | |
| Color conversion layer(B) | Color conversion layer 1 | ○ | | | | | | | |
| | Color conversion layer 2 | | ○ | | | | | | |
| | Color conversion layer 3 | | | ○ | | | | | |
| | Color conversion layer 4 | | | | ○ | ○ | | | |
| | Color conversion layer 5 | | | | | | | ○ | ○ |
| | Color conversion layer 6 | | | | | | ○ | | |
| Color filter (C) | C-b1 (thickness [μm]) | D-b1 (2.5) | D-b1 (2.5) | D-b1 (2.5) | D-b1 (2.5) | D-b2 (3) | D-b1 (2.5) | D-b1 (2.5) | D-b1 (3.5) |
| | C-g1 (thickness [μm]) | D-g1 (2.5) | D-g1 (2.5) | D-g1 (2.5) | D-g1 (2.5) | D-g1 (3) | D-g1 (2.5) | D-g1 (2.5) | D-g1 (3.5) |
| | C-r1 (thickness [μm]) | D-r1 (2.5) | D-r1 (2.5) | D-r1 (2.5) | D-r1 (2.5) | D-r1 (3) | D-r1 (2.5) | D-r1 (2.5) | D-r1 (3.5) |
| Maximum peak wavelength [nm] | Tb (x) | 450 | 450 | 450 | 450 | 450 | 450 | 450 | 450 |
| | Tg (x) | 540 | 540 | 540 | 540 | 540 | 540 | 540 | 540 |
| | Tr (x) | 635 | 635 | 635 | 635 | 635 | 635 | 635 | 635 |
| Maximum peak wavelength of l(x) [nm] | Peakb | 459 | 459 | 459 | 459 | 459 | 459 | 443 | 443 |
| | Peakg | 535 | 540 | 530 | 530 | 530 | 527 | 542 | 542 |
| | Peakr | 640 | 634 | 646 | 646 | 646 | 640 | 608 | 608 |
| Full width at half maximum at maximum peak wavelength of l(x) [nm] | FWHMb | 24 | 24 | 24 | 24 | 24 | 25 | 25 | 25 |
| | FWHMg | 21 | 19 | 23 | 24 | 24 | 35 | 36 | 36 |
| | FWHMr | 23 | 24 | 29 | 29 | 29 | 24 | 45 | 45 |
| α [condition (I)] | | 1.22 | 1.34 | 1.44 | 1.44 | 1.44 | 1.29 | 1.81 | 1.81 |
| β [condition (II)] | | 65.2 | 65.2 | 65.2 | 65.2 | 63.8 | 65.2 | 66.7 | 62.4 |
| Coverage Y [%] | | 72.6 | 69.8 | 73.1 | 73.0 | 81.7 | 71.2 | 53.5 | 59.1 |
| Extraction efficiency Z [%] | | 32.9 | 32.3 | 33.6 | 33.6 | 30.9 | 33.9 | 31.7 | 28.3 |
| Performance evaluation value [%] | | 23.9 | 22.6 | 24.6 | 24.6 | 25.3 | 24.1 | 17.0 | 16.7 |

In the table, the types of the light source (A) and the color conversion layer (B) used for Examples and Comparative Examples are shown by "○" in the corresponding column, and the types of the coloring curable resin compositions used for the color filters C-b1, C-g2, and C-r1 are shown in the column of Color filter (C) together with the thickness [μm] of the color filter.

REFERENCE SIGNS LIST 10, 20, 30: non-overlapping region, 40: overlapping region, 100: display device, 110: light source, 120: color conversion layer, 130: color filter, 200: display, 201: liquid crystal panel

The invention claimed is:

1. A display device comprising: a light source (A); a color conversion layer (B); and a color filter (C),
    wherein the color conversion layer (B) contains quantum dots (B-r) that emit red light,
    the color filter (C) has a blue color filter (C-b), a green color filter (C-g), and a red color filter (C-r), and
    the display device satisfies the following conditions (I) and (II):

$$\alpha \leq 1.80; \text{ and} \qquad (I)$$

$$\beta \geq 63.0, \qquad (II)$$

wherein $\alpha = \alpha_b + \alpha_g + \alpha_r$, and $\beta = \beta_b + \beta_g + \beta_r$;

in a spectrum curve I(x) obtained by plotting intensity I of light emitted from the color conversion layer (B) when the color conversion layer (B) is irradiated with light from the light source (A) versus wavelength x, when a pulse function that gives 0 in wavelength ranges of 380 nm≤x<440 nm, 460 nm<x<520 nm, 540 nm<x<620 nm, and 650 nm<x≤780 nm, and gives a value equal to the maximum intensity of the spectrum curve I(x) in wavelength ranges of 440 nm≤x≤460 nm, 520 nm≤x≤540 nm, and 620 nm≤x≤650 nm is expressed by a function f(x), $\alpha_b$ represents a proportion of a region that does not overlap with a region of the function f(x) in a region of the spectrum curve I(x) in a wavelength range of 380 nm≤x<495 nm, $\alpha_g$ represents a proportion of a region that does not overlap with a region of the function f(x) in a region of the spectrum curve I(x) in a wavelength range of 495 nm≤x≤585 nm, and $\alpha_r$ represents a proportion of a region that does not overlap with a region of the function f(x) in a region of the spectrum curve I(x) in a wavelength range of 585 nm<x≤780 nm; and in a spectrum curve $T_b$(x) obtained by plotting light transmittance $T_b$ of the blue color filter (C-b) versus wavelength x, in a spectrum curve $T_g$(x) obtained by plotting light transmittance $T_g$ of the green color filter (C-g) versus wavelength x, and in a spectrum curve $T_r$(x) obtained by plotting light transmittance $T_r$ of the red color filter (C-r) versus wavelength x, when a pulse function that gives 0 in wavelength ranges of 380 nm≤x<440 nm, 460 nm<x<520 nm, 540 nm<x<620 nm, and 650 nm<x≤780 nm, and gives a light transmittance of 100% in wavelength ranges 440 nm≤x≤460 nm, 520 nm≤x≤540 nm, and 620 nm≤x≤650 nm is represented by a function g(x), $\beta_b$ represents an area of a region where a region of the spectrum curve $T_b$(x) and a region of the function g(x) overlap in the wavelength range of 440 nm≤x≤460 nm, $\beta_g$ represents an area of a region where a region of the spectrum curve $T_g$(x) and a region of the function g(x) overlap in the wavelength range of 520 nm≤x≤540 nm, and $\beta_r$ represents an area of a region where a region of the spectrum curve $T_r$(x) and a region of the function g(x) overlap in the wavelength range of 620 nm≤x≤650 nm.

2. The display device according to claim 1, wherein the light source (A) emits light having a peak at a wavelength of 600 nm or less.

3. The display device according to claim 1, wherein the light emitted from the color conversion layer (B) when the color conversion layer (B) is irradiated with light from the light source (A) is white light.

4. The display device according to claim 1, wherein the spectrum curve I(x) has a peak in each of the wavelength ranges of 440 nm to 460 nm, 520 nm to 540 nm, and 620 nm to 650 nm, and a full width at half maximum of each peak is 20 nm to 80 nm.

5. The display device according to claim 1, wherein the quantum dots (B-r) that emit red light contain at least one selected from the group consisting of particles of an indium compound and particles of a cadmium compound.

6. The display device according to claim 1, wherein the color conversion layer (B) has a thickness of 1 μm or more and 300 μm or less.

7. The display device according to claim 1, wherein the spectrum curve $T_b$(x) has a peak in a wavelength range of 440 nm to 460 nm.

8. The display device according to claim 1, wherein the spectrum curve $T_g$(x) has a peak in a wavelength range of 520 nm to 540 nm.

9. The display device according to claim 1, wherein the spectrum curve $T_r$(x) has a peak in a wavelength range of 620 nm to 660 nm.

10. A display comprising the display device according to claim 1.

* * * * *